(12) United States Patent
Wei

(10) Patent No.: US 6,473,878 B1
(45) Date of Patent: Oct. 29, 2002

(54) SERIAL-CONCATENATED TURBO CODES

(75) Inventor: Lee-Fang Wei, Lincroft, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/451,070

(22) Filed: Nov. 30, 1999

Related U.S. Application Data

(60) Provisional application No. 60/136,583, filed on May 28, 1999, and provisional application No. 60/158,473, filed on Oct. 8, 1999.

(51) Int. Cl.[7] .............................................. H03M 13/31
(52) U.S. Cl. ........................ 714/755; 375/265; 714/792
(58) Field of Search ................................. 714/755, 792; 375/265

(56) References Cited

U.S. PATENT DOCUMENTS

| | | | |
|---|---|---|---|
| 4,941,154 A | | 7/1990 | Wei .............................. 375/39 |
| 5,363,408 A | * | 11/1994 | Paik et al. ..................... 375/39 |
| 5,416,804 A | * | 5/1995 | Khaled et al. ............... 375/341 |
| 5,442,626 A | * | 8/1995 | Wei .............................. 370/20 |
| 5,706,312 A | | 1/1998 | Wei ............................. 375/298 |
| 5,790,570 A | * | 8/1998 | Heegard et al. ........... 371/37.4 |
| 6,023,783 A | * | 2/2000 | Divsalar et al. ............ 714/792 |

OTHER PUBLICATIONS

Ghosh, "Error Correction Schemes for Digital Television Broadcasting", IEEE Transactions on Consumer Electronics, vol. 41, No. 3, Aug. 1995, pp. 400–404.*

Benedetto et al., "Serial Concatenated Trellis Coded Moulation with Iterative Decoding", 1997 Int'l. Symposium on Information Theory, p. 8.*

H. Ogiwara et al., Iterative Decoding of Serially Concatenated Punctured Trellis–Coded Modulation,: *IEEE International Conference on Communications*, vol. 2, p. 1167–1171 (Jun. 6–10, 1999).

T. Wadayama et al., "Matched Design Method for Concatenated Trellis–Coded Modulation," *IEICE Transactions on Fundamentals*, vol. E79–A, No. 11, p. 1911–1917 (Nov. 1996).

P. Robertson et al., "A Novel Bandwidth Efficient Coding Scheme Employing Turbo Codes," *IEEE International Conference on Communications*, p. 962–967 (Jun. 1996).

U. Wachsmann et al., "Power and Bandwidth Efficient Digital Communication Using Turbo Codes in Multilevel Codes," *European Transactions on Telecommunications*, vol. 6, No. 5, pp. 557–567 (Sep.–Oct. 1995).

S. Benedetto et al., "Serial Concatenation of Interleaved Codes: Performance Analysis, Design, and Iterative Decoding," *IEEE Transactions on Information Theory*, vol. 44, No. 3, pp. 909–926 (May 1998).

(List continued on next page.)

*Primary Examiner*—Stephen M. Baker
(74) *Attorney, Agent, or Firm*—Ronald D. Slusky; Thomas Stafford

(57) ABSTRACT

Advantageous error rate performance, high bandwidth efficiency, low delay and reduced error floor are achieved at an acceptable level of decoding complexity via the use of serial concatenated turbo codes. These are codes for which at least some of the output bits, including at least one redundant bit, provided by a first, outer encoder are, after interleaving, further processed by a second, inner encoder. The resulting data and redundant bits then select a symbol from a predetermined constellation for transmission. In the receiver, the turbo code is decoded using a corresponding number of soft output decoders which operates iteratively in such a way that improved performance as compared to a single encoding can be achieved. The turbo codes can be of various dimensionalities and can be used as a component of a multilevel code to achieve a desired level of bandwidth efficiency.

64 Claims, 23 Drawing Sheets

OTHER PUBLICATIONS

C. Berrou et al., "Near Shannon Limit Error–Correcting Coding and Decoding: Turbo–Codes (1)," *Proceedings 1993 International Conference Communications*, Geneva, Switzerland, pp. 1064–1070 (1993).

G. D. Forney, Jr. et al., "Modulation and Coding for Linear Gaussian Channels," *IEEE Transactions on Information Theory*, vol. 44, No. 6, pp. 2384–2415 (Oct. 1998).

S. Benedeto et al., "Bandwidth efficient parallel concatenated coding schemes," *Electronics Letters*, vol. 31, No. 24, pp. 2067–2069 (Nov. 23, 1995).

P. Robertson et al., "Coded modulation scheme employing turbo codes," *Electronics Letters*, vol. 31, No. 18, pp. 1546–1547 (Aug. 31, 1995).

* cited by examiner (+) : EXCLUSIVE OR $Z^{-1}$ : DELAY ELEMENT WITH DELAY OF ONE SYMBOL INTERVAL

FIG. 5

K (=14) COLUMNS

```
           0    1    2    3    4    5    6    7    8    9   10   11   12   13
              (=K₁)
```

|     | 0 | 1 | 2 | 3 | 4 | 5 | 6 | 7 | 8 | 9 | 10 | 11 | 12 | 13 |
|---|---|---|---|---|---|---|---|---|---|---|---|---|---|---|
| 0  | 0 | 7 | 1 | 8 | 2 | 9 | 3 | 10 | 4 | 11 | 5 | 12 | 6 | 13 |
| 1  | 28 | 35 | 29 | 36 | 30 | 37 | 31 | 38 | 32 | 39 | 33 | 40 | 34 | 41 |
| 2  | 56 | 63 | 57 | 64 | 58 | 65 | 59 | 66 | 60 | 67 | 61 | 68 | 62 | 69 |
| 3  | 84 | 91 | 85 | 92 | 86 | 93 | 87 | 94 | 88 | 95 | 89 | 96 | 90 | 97 |
| 4  | 112 | 119 | 113 | 120 | 114 | 121 | 115 | 122 | 116 | 123 | 117 | 124 | 118 | 125 |
| 5  | 140 | 147 | 141 | 148 | 142 | 149 | 143 | 150 | 144 | 151 | 145 | 152 | 146 | 153 |
| 6  | 168 | 175 | 169 | 176 | 170 | 177 | 171 | 178 | 172 | 179 | 173 | 180 | 174 | 181 |
| 7 (=J₁) | 14 | 21 | 15 | 22 | 16 | 23 | 17 | 24 | 18 | 25 | 19 | 26 | 20 | 27 |
| 8  | 42 | 49 | 43 | 50 | 44 | 51 | 45 | 52 | 46 | 53 | 47 | 54 | 48 | 55 |
| 9  | 70 | 77 | 71 | 78 | 72 | 79 | 73 | 80 | 74 | 81 | 75 | 82 | 76 | 83 |
| 10 | 98 | 105 | 99 | 106 | 100 | 107 | 101 | 108 | 102 | 109 | 103 | 110 | 104 | 111 |
| 11 | 126 | 133 | 127 | 134 | 128 | 135 | 129 | 136 | 130 | 137 | 131 | 138 | 132 | 139 |
| 12 | 154 | 161 | 155 | 162 | 156 | 163 | 157 | 164 | 158 | 165 | 159 | 166 | 160 | (167) |
| 13 | 182 | 189 | 183 | 190 | 184 | 191 | 185 | 192 | 186 | (193) | 187 | (194) | 188 | (195) |

J (=14) ROWS

SEQUENCE NUMBER OF THE INPUT BIT GROUP

|    |    |    |    |    | 25 | 30 |    | 10 | 9  | 14 |    |    |    |    |
|    |    |    |    | 16 | 7  | 4  | 3  | 0  | 23 | 20 | 19 | 16 | 7  |    |    |
|    |    |    | 21 | 18 | 17 | 6  | 5  | 2  | 1  | 22 | 21 | 18 | 17 | 6  | 5  | 2  |
|    |    |    | 24 | 31 | 28 | 11 | 8  | 15 | 12 | 27 | 24 | 31 | 28 | 11 | 8  | 15 |
|    |    | 26 | 25 | 30 | 29 | 10 | 9  | 14 | 13 | 26 | 25 | 30 | 29 | 10 | 9  | 14 | 13 |
|    |    | 7  | 4  | 3  | 0  | 23 | 20 | 19 | 16 | 7  | 4  | 3  | 0  | 23 | 20 | 19 | 16 |
| 17 |    | 6  | 5  | 2  | 1  | 22 | 21 | 18 | 17 | 6  | 5  | 2  | 1  | 22 | 21 | 18 | 17 | 6 |
| 28 |    | 11 | 8  | 15 | 12 | 27 | 24 | 31 | 28 | 11 | 8  | 15 | 12 | 27 | 24 | 31 | 28 | 11 |
| 29 |    | 10 | 9  | 14 | 13 | 26 | 25 | 30 | 29 | 10 | 9  | 14 | 13 | 26 | 25 | 30 | 29 |
|    |    | 23 | 20 | 19 | 16 | 7  | 4  | 3  | 0  | 23 | 20 | 19 | 16 | 7  | 4  | 3  | 0  | 23 |
| 1  |    | 22 | 21 | 18 | 17 | 6  | 5  | 2  | 1  | 22 | 21 | 18 | 17 | 6  | 5  | 2  | 1  | 22 |
| 12 |    | 27 | 24 | 31 | 28 | 11 | 8  | 15 | 12 | 27 | 24 | 31 | 28 | 11 | 8  | 15 | 12 | 27 |
|    |    | 26 | 25 | 30 | 29 | 10 | 9  | 14 | 13 | 26 | 25 | 30 | 29 | 10 | 9  | 14 | 13 |
|    |    | 7  | 4  | 3  | 0  | 23 | 20 | 19 | 16 | 7  | 4  | 3  | 0  | 23 | 20 | 19 | 16 |
|    |    |    | 5  | 2  | 1  | 22 | 21 | 18 | 17 | 6  | 5  | 2  | 1  | 22 | 21 | 18 |
|    |    |    | 8  | 15 | 12 | 27 | 24 | 31 | 28 | 11 | 8  | 15 | 12 | 27 | 24 | 31 |
|    |    |    |    |    | 13 | 26 | 25 | 30 | 29 | 10 | 9  | 14 | 13 | 26 |
|    |    |    |    |    |    | 4  | 3  | 0  |    | 20 | 19 |    |    |    |    |

FIG. 17

| X5 X4 X3 X2 X1 X0 | Y2 Y1 Y0 | Y2' Y1' Y0' |
|---|---|---|
| 0 | 0 | 0 |
| 1 | 0 | 1 |
| 2 | 0 | 2 |
| 3 | 0 | 3 |
| 4 | 3 | 3 |
| 5 | 3 | 2 |
| 6 | 3 | 1 |
| 7 | 3 | 0 |
| 8 | 2 | 2 |
| 9 | 2 | 3 |
| 10 | 2 | 0 |
| 11 | 2 | 1 |
| 12 | 1 | 1 |
| 13 | 1 | 0 |
| 14 | 1 | 3 |
| 15 | 1 | 2 |
| 16 | 0 | 4 |
| 17 | 0 | 5 |
| 18 | 0 | 6 |
| 19 | 0 | 7 |
| 20 | 3 | 7 |
| 21 | 3 | 6 |
| 22 | 3 | 5 |
| 23 | 3 | 4 |
| 24 | 2 | 6 |
| 25 | 2 | 7 |
| 26 | 2 | 4 |
| 27 | 2 | 5 |
| 28 | 1 | 5 |
| 29 | 1 | 4 |
| 30 | 1 | 7 |
| 31 | 1 | 6 |
| 32 | 4 | 4 |
| 33 | 4 | 5 |
| 34 | 4 | 6 |
| 35 | 4 | 7 |
| 36 | 7 | 7 |
| 37 | 7 | 6 |
| 38 | 7 | 5 |
| 39 | 7 | 4 |
| 40 | 6 | 6 |
| 41 | 6 | 7 |
| 42 | 6 | 4 |
| 43 | 6 | 5 |
| 44 | 5 | 5 |
| 45 | 5 | 4 |
| 46 | 5 | 7 |
| 47 | 5 | 6 |
| 48 | 4 | 0 |
| 49 | 4 | 1 |
| 50 | 4 | 2 |
| 51 | 4 | 3 |
| 52 | 7 | 3 |
| 53 | 7 | 2 |
| 54 | 7 | 1 |
| 55 | 7 | 0 |
| 56 | 6 | 2 |
| 57 | 6 | 3 |
| 58 | 6 | 0 |
| 59 | 6 | 1 |
| 60 | 5 | 1 |
| 61 | 5 | 0 |
| 62 | 5 | 3 |
| 63 | 5 | 2 |

| X7 X6 | Y3 | Y3' |
|---|---|---|
| 0　0 | 0 | 0 |
| 0　1 | 0 | 1 |
| 1　0 | 1 | 1 |
| 1　1 | 1 | 0 |

DECIMAL EQUIVALENT
OF Y3Y2Y1Y0
(or Y3´Y2´Y1´Y0´)

FIG. 23

| X5 X4 X3 X2 X1 X0 | Y2 Y1 Y0 | Y2' Y1' Y0' |
|---|---|---|
| 0 | 0 | 0 |
| 1 | 0 | 1 |
| 2 | 1 | 1 |
| 3 | 1 | 0 |
| 4 | 2 | 0 |
| 5 | 2 | 1 |
| 6 | 3 | 1 |
| 7 | 3 | 0 |
| 8 | 2 | 2 |
| 9 | 2 | 3 |
| 10 | 3 | 3 |
| 11 | 3 | 2 |
| 12 | 0 | 2 |
| 13 | 0 | 3 |
| 14 | 1 | 3 |
| 15 | 1 | 2 |
| 16 | 0 | 4 |
| 17 | 0 | 5 |
| 18 | 1 | 5 |
| 19 | 1 | 4 |
| 20 | 2 | 4 |
| 21 | 2 | 5 |
| 22 | 3 | 5 |
| 23 | 3 | 4 |
| 24 | 2 | 6 |
| 25 | 2 | 7 |
| 26 | 3 | 7 |
| 27 | 3 | 6 |
| 28 | 0 | 6 |
| 29 | 0 | 7 |
| 30 | 1 | 7 |
| 31 | 1 | 6 |

| X5 X4 X3 X2 X1 X0 | Y2 Y1 Y0 | Y2' Y1' Y0' |
|---|---|---|
| 32 | 4 | 4 |
| 33 | 4 | 5 |
| 34 | 5 | 5 |
| 35 | 5 | 4 |
| 36 | 6 | 4 |
| 37 | 6 | 5 |
| 38 | 7 | 5 |
| 39 | 7 | 4 |
| 40 | 6 | 6 |
| 41 | 6 | 7 |
| 42 | 7 | 7 |
| 43 | 7 | 6 |
| 44 | 4 | 6 |
| 45 | 4 | 7 |
| 46 | 5 | 7 |
| 47 | 5 | 6 |
| 48 | 4 | 0 |
| 49 | 4 | 1 |
| 50 | 5 | 1 |
| 51 | 5 | 0 |
| 52 | 6 | 0 |
| 53 | 6 | 1 |
| 54 | 7 | 1 |
| 55 | 7 | 0 |
| 56 | 6 | 2 |
| 57 | 6 | 3 |
| 58 | 7 | 3 |
| 59 | 7 | 2 |
| 60 | 4 | 2 |
| 61 | 4 | 3 |
| 62 | 5 | 3 |
| 63 | 5 | 2 |

FIG. 28

| X3 | X2 | X1 | X0 | Y1 | Y0 | Y1´ | Y0´ |
|---|---|---|---|---|---|---|---|
| 0 | 0 | 0 | 0 | 0 | 0 | 0 | 0 |
| 0 | 0 | 0 | 1 | 0 | 0 | 0 | 1 |
| 0 | 0 | 1 | 0 | 0 | 0 | 1 | 0 |
| 0 | 0 | 1 | 1 | 0 | 0 | 1 | 1 |
| 0 | 1 | 0 | 0 | 1 | 1 | 1 | 1 |
| 0 | 1 | 0 | 1 | 1 | 1 | 1 | 0 |
| 0 | 1 | 1 | 0 | 1 | 1 | 0 | 1 |
| 0 | 1 | 1 | 1 | 1 | 1 | 0 | 0 |
| 1 | 0 | 0 | 0 | 1 | 0 | 1 | 0 |
| 1 | 0 | 0 | 1 | 1 | 0 | 1 | 1 |
| 1 | 0 | 1 | 0 | 1 | 0 | 0 | 0 |
| 1 | 0 | 1 | 1 | 1 | 0 | 0 | 1 |
| 1 | 1 | 0 | 0 | 0 | 1 | 0 | 1 |
| 1 | 1 | 0 | 1 | 0 | 1 | 0 | 0 |
| 1 | 1 | 1 | 0 | 0 | 1 | 1 | 1 |
| 1 | 1 | 1 | 1 | 0 | 1 | 1 | 0 |

| X3 | X2 | X1 | X0 | Y1 | Y0 | Y1' | Y0' |
|----|----|----|----|----|----|-----|-----|
| 0 | 0 | 0 | 0 | 0 | 0 | 0 | 0 |
| 0 | 0 | 0 | 1 | 0 | 0 | 0 | 1 |
| 0 | 0 | 1 | 0 | 0 | 1 | 0 | 1 |
| 0 | 0 | 1 | 1 | 0 | 1 | 0 | 0 |
| 0 | 1 | 0 | 0 | 1 | 0 | 0 | 0 |
| 0 | 1 | 0 | 1 | 1 | 0 | 0 | 1 |
| 0 | 1 | 1 | 0 | 1 | 1 | 0 | 1 |
| 0 | 1 | 1 | 1 | 1 | 1 | 0 | 0 |
| 1 | 0 | 0 | 0 | 1 | 0 | 1 | 0 |
| 1 | 0 | 0 | 1 | 1 | 0 | 1 | 1 |
| 1 | 0 | 1 | 0 | 1 | 1 | 1 | 1 |
| 1 | 0 | 1 | 1 | 1 | 1 | 1 | 0 |
| 1 | 1 | 0 | 0 | 0 | 0 | 1 | 0 |
| 1 | 1 | 0 | 1 | 0 | 0 | 1 | 1 |
| 1 | 1 | 1 | 0 | 0 | 1 | 1 | 1 |
| 1 | 1 | 1 | 1 | 0 | 1 | 1 | 0 |

SERIAL-CONCATENATED TURBO CODES

This application claims priority of Provisional Application Serial No. 60/136,583 which was filed on May 28, 1999 and Provisional Application Serial No. 60/158,473 which was filed on Oct. 8, 1999.

BACKGROUND OF THE INVENTION

The present invention relates to digital data transmission and, in particular, to error correcting codes.

Continued advances in forward error-correcting codes, such as convolutional codes and trellis codes, have enabled designers of modems, wireless communications systems and other digital communications systems to achieve increased bit rates for a given level of error rate performance. Among the various innovations that have been introduced over the years are so-called turbo codes. At the heart of the turbo code concept is the encoding of input data using more than one encoder combined with an interleaver in such a way that improved performance (as compared to a single encoding) can be achieved using a corresponding number of so-called soft input/soft output decoders which operate iteratively.

An early description of turbo codes appears in C. Berrou, et al, "Near Shannon limit error-correcting coding and decoding: Turbo codes," *Proc. 1993 Int. Conf Communication* (Geneva, Switzerland, May 1993), pp. 1064-1070. Berrou et al discloses a so-called parallel-concatenated turbo code. The input data is applied to a first convolutional encoder and an interleaved version of the input data is applied to a second convolutional encoder. The output bits of the two encoders are then mapped into signal points of a two-dimensional (2D) 4-PSK signaling constellation for transmission. Some of the redundant bits generated by the encoders may be subjected to a so-called puncturing prior to the mapping step in order to improve bandwidth efficiency (measured in bits per 2D signal point).

At relatively high error rates, a parallel concatenated turbo code provides excellent coding gain, thereby advantageously reducing the level of received signal-to-noise ratio required in order to realize a desired level of error rate performance. Disadvantageously, however, achieving that excellent coding gain requires an extremely long interleaver. This introduces significant end-to-end delay, or latency, which is undesirable in many applications. Moreover, a parallel-concatenated turbo code exhibits a so-called error floor phenomenon wherein the improvement in coding gain is far less dramatic at lower error rates and, indeed, may be comparable to, or even worse than, that achieved using more conventional encoding and decoding.

Also known in the prior art are so-called serial-concatenated turbo codes, as disclosed, for example, by S. Benedetto, et al, "Serial concatenation of interleaved codes: Performance analysis, design, and iterative decoding," *IEEE Trans. Inform. Theory*, vol. 44, pp. 909-926, May 1998. Here, the input data is applied to a first convolutional encoder and the output bits of the first encoder, after interleaving, are used as the input bits for a second convolutional encoder. The output bits of the second encoder are then mapped into signal points of a 2D 4-PSK signaling constellation for transmission. The above-mentioned error floor phenomenon is less pronounced for serial-concatenated turbo codes than for parallel-concatenated turbo codes, thereby providing better coding gain at lower error rates. However, these serial-concatenated turbo codes generate more redundant bits than in the parallel case, so that they are less bandwidth-efficient. Moreover, they too require a long interleaver.

Neither the parallel-concatenated, nor the serial-concatenated turbo codes described in the above-discussed prior art references are bandwidth efficient; each of them has a bandwidth efficiency of less than two bits per 2D signal point. More bandwidth-efficient parallel concatenated turbo codes are known, however. See, for example, S. Benedetto, et al, "Bandwidth efficient parallel concatenated coding schemes," *Electron. Lett.*, vol. 31, pp. 2067–2069, 1995, and P. Robertson, et al, "Coded modulation scheme employing turbo codes," *Electron. Lett.*, vol. 31, pp. 1546–1547, 1995. The arrangements disclosed in these references achieve high coding gains at high error rate while featuring an improved bandwidth efficiency of a full 2 bits per 2D signal point by using rate-$2/3$ trellis codes designed jointly with a 2D 8-PSK signaling constellation rather than the convolutional codes with a 2D 4-PSK constellation used in the Berrou arrangement. However, these latter codes still exhibit the above-mentioned error floor phenomenon and long delays.

The prior art also teaches that another way of achieving increased bandwidth efficiency while achieving the advantages of the turbo code approach is to employ so-called multi-level coding in which the code used in at least one of the levels is a parallel-concatenated turbo code of the kind disclosed by Berrou. (As is well known, a multilevel code is one in which the output bits of different codes are used to select increasingly finer subsets, and ultimately a single signal point, of the signal constellation.) Such a code is disclosed in U. Wachsmann, et al, "Power and bandwidth efficient digital communication using turbo codes in multi-level codes," *Euro. Trans. Telecommun.*, vol. 6, pp. 557–567, September 1995. However, the error floor and delay characteristics of such a multi-level code promise to be no better—and may prove to be worse—than that of the parallel-concatenated turbo code used in a non-multi-level-coding arrangement.

There has remained a need in the art for turbo coding arrangements which exhibit turbo codes' advantageous error rate performance, achieve high bandwidth efficiency, low delay and less pronounced error floor, while yet involving an acceptable level of decoding complexity.

SUMMARY OF THE INVENTION

Turbo codes embodying the principles of the invention are serial-concatenated codes, herein defined to mean turbo codes for which at least some of the output bits, including at least one redundant bit, provided by a first, outer encoder are further processed, after interleaving, by a second, inner encoder. The present turbo codes may be of any desired dimensionality, $N \geq 1$, meaning that the data to be transmitted is represented by an N-tuple, or N-dimensional symbol, whose N coordinates are selected by the output bits of the encoders interdependently. For example, when N is an even integer, an N-dimensional symbol may be conveniently transmitted, during an N-dimensional "symbol interval," as a combination of N/2 2D signal points, wherein each so-called signal space coordinate of the 2D signal point is represented, during a 2D "signaling interval," by the amplitude of an in-phase or quadrature-phase component of a modulated carrier signal. Thus the aforementioned symbol interval is made up of N/2 signaling intervals. For the code where N=2, the symbol interval and the signaling interval are the same.

More specifically, in turbo codes embodying the principles of the invention a) the state of each of the inner and outer encoders is advanced only once per symbol interval, and b) all of the data bits, and at least one redundant bit generated by one or both of the encoders for that symbol interval are transmitted together during a single symbol interval, and c) the inner and outer encoders are trellis encoders. This approach advantageously provides turbo codes having a lower delay than the prior art arrangements and, in addition, affords an advantageous combination of error rate performance, bandwidth efficiency, and decoder complexity not achieved by prior art arrangements and exhibiting a less pronounced (or perhaps no) error floor. The inner and outer codes may be of any desired dimensionality.

Arrangements embodying the principles of the invention utilize a signal constellation of sufficient size (i.e., number of symbols in the constellation) to accommodate the transmission of the data bits and redundant bits within the aforementioned single symbol interval. Moreover, in preferred embodiments, the turbo code, the constellation, and the mapping between the bits to be transmitted and the constellation symbols are selected in view of the one another in such a way that the code complexity and interleaving delay necessary to achieve a given level of error rate performance are less than they would be if the turbo code, constellation and mapping were not selected in view of one another. This is referred to in the art as a "joint design," as more formally defined hereinbelow.

In preferred embodiments, all the redundant bits generated by both the inner and outer encoders are transmitted (as compared to the puncturing approach used by Berrou et al in which not all the redundant bits are transmitted), thereby taking advantage of the full amount of coding gain promised by the combined codes without sacrificing bandwidth efficiency. Although the prior art serial-concatenated codes can also transmit all the redundant bits generated by the encoders, they can do so only at the cost of substantially reduced bandwidth efficiency.

In preferred embodiments, less than all of the data bits processed by the outer encoder are further processed by the inner encoder. As compared to a case in which all of the data bits processed by the outer encoder are further processed by the inner encoder, this approach advantageously allows for a far less complex decoder and requires less delay while sacrificing, at most, a small amount of coding gain.

For various reasons, as described more fully hereinbelow, it may be advantageous to "terminate" the turbo code, meaning that both encoders are brought to a known state. In accordance with an advantageous aspect of the present invention, I have discovered that the overall turbo code can be terminated by terminating the outer and inner codes independently in distinct symbol intervals. In the illustrative embodiment, in particular, the state of the outer encoder is not advanced during symbol intervals in which the code of the inner encoder is being terminated.

In multidimensional embodiments of the invention as described above, i.e. for N>2, the interleaver, in rearranging the outputs of the outer encoder, preferably uses as its interleaved elements the outer encoder outputs associated with a particular symbol interval, rather than, for example, the bits associated with the constituent signaling intervals of the symbol interval. I have found that such an approach advantageously drastically reduces the delay introduced by the interleaver and simplifies the steps required to terminate the turbo codes.

Arrangements embodying the principles of the invention may use the turbo-encoder output bits to identify a subset of the signal constellation and directly use yet other, uncoded bits to select a particular symbol from the identified subset. However, in order to realize the full coding gain offered by the turbo code, it may be desired to use a multi-level coding approach to encode at least some of those other bits using, for example, a simple parity check code, applying the design principles described in my U.S. Pat. No. 5,258,987 issued Nov. 2, 1993.

BRIEF DESCRIPTION OF THE DRAWING

FIG. 5 illustrates the operation of the interleaver of the turbo encoder of FIG. 1;

FIGS. 6–9 are various signal constellations that can be used by the turbo encoder of FIG. 1;

FIGS. 17 and 18 represent the operation of bit converters illustratively used in the turbo encoder of FIG. 14;

Figure 21:
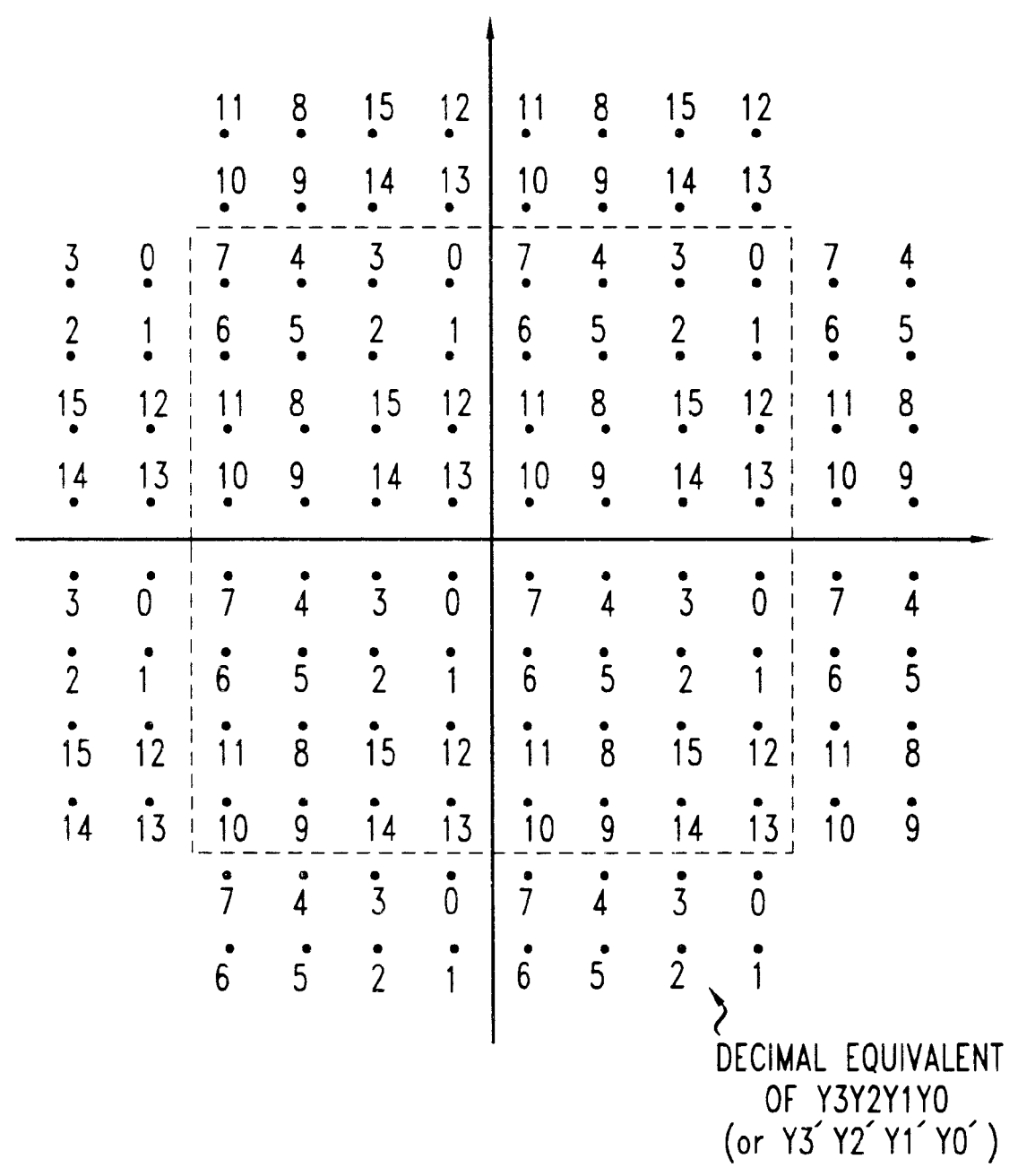

FIGS. 19–22 are various signal constellations that can be used by the turbo encoder of FIG. 14;

FIG. 23 represents the operation of one of the bit converters that can be used in the turbo encoder of FIG. 14 when the constellation used is that of FIG. 22;

FIG. 28 represents the operation of the bit converter illustratively used in the turbo encoder of FIG. 27;

DETAILED DESCRIPTION

Turbo Encoder Overview

Figure 1:
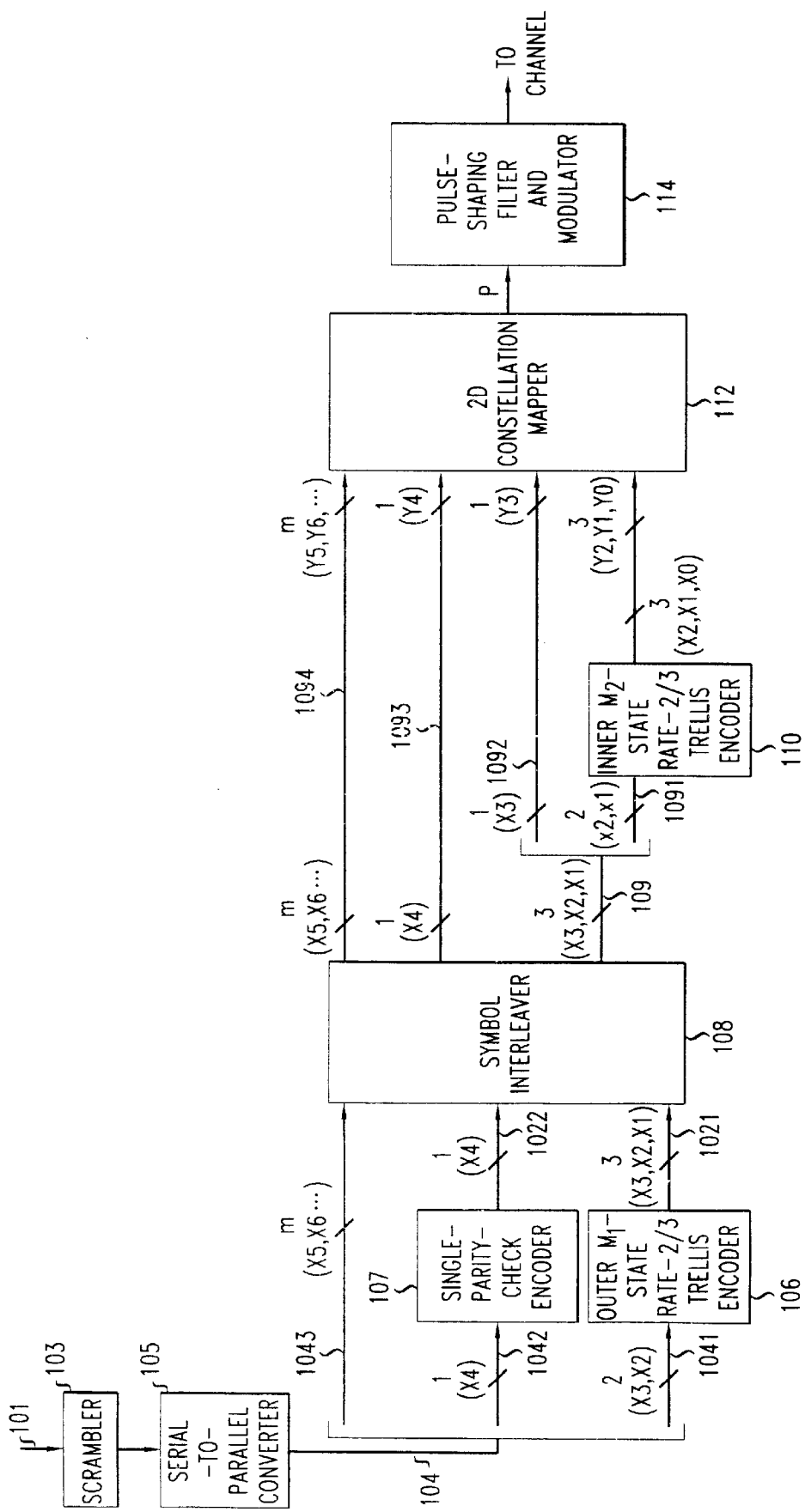
FIG. 1 is a transmitter including a first embodiment of a turbo encoder embodying the principles of the present invention;.

FIG. 1 is a block diagram of a transmitter which includes a serial-concatenated turbo encoder embodying the principles of the invention. A sequence of data bits on lead 101 is applied to a conventional scrambler 103, which randomizes the data and thence to serial-to-parallel converter 105 which, for each of a sequence of symbol intervals of duration T seconds, provides a data word comprising a number of data bits on its output leads 1041, 1042 and 1043 which are collectively referred to herein as leads 104. In particular embodiments of the transmitter of FIG. 1, two data bits are provided on lead 1041, one bit on lead 1042, and m bits on lead 1043. In an embodiment to be described first, however, it is assumed that only the bits on leads 1041, bits X3,X2, are present. Thus in the initial portion of the discussion which follows, it is assumed that no other data bits are present on leads 1042 and 1043 and that, of course, none of processing carried out by the circuitry shown in FIG. 1 involves such other bits.

Figure 2:
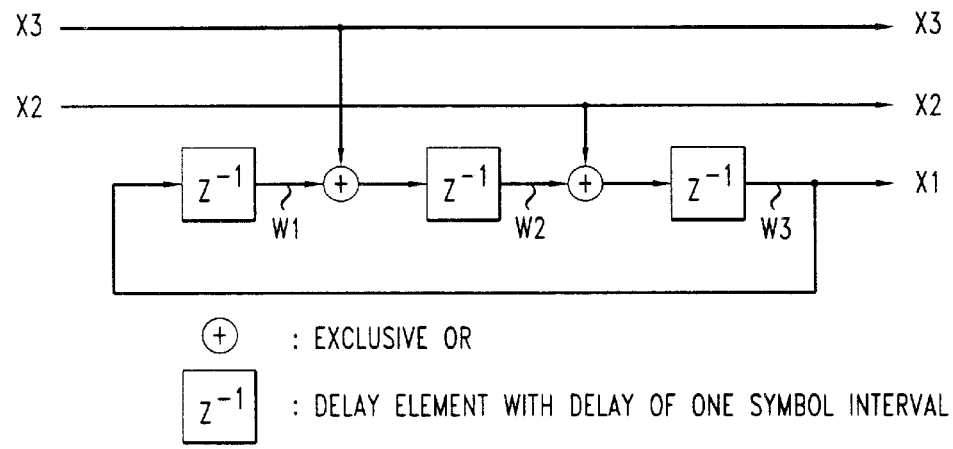
FIGS. 2–4 are illustrative embodiments of inner and outer encoders that can be used in the turbo encoder of FIG. 1.
Figure 3:
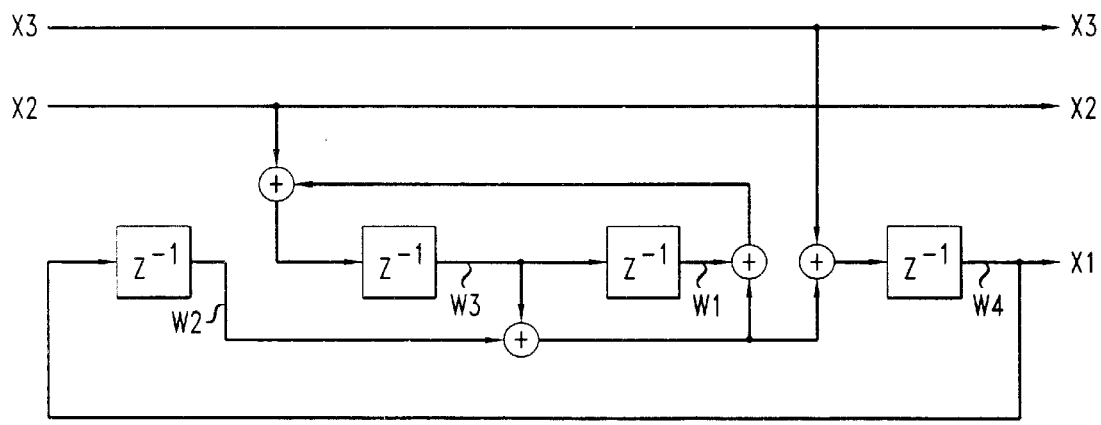

Bits X3,X2 are applied to an outer trellis encoder 106, which is an $M_1$-state, rate-⅔ encoder. Encoder 106 is a so-called systematic encoder, so that it provides input bits X3,X2 as two of its three output bits. The encoder's third output bit is redundant bit X1. Illustrative embodiments for outer encoder 106 are shown in FIGS. 2 and 3. The encoder of FIG. 2 is an 8-state code in that it comprises three delay elements whose contents at any point in time can be any one of ($2^3$=) 8 bit combinations. The delay of each delay element is equal to the symbol interval and thus the values stored in the delay elements, and thus the encoder state, changes once per symbol interval, corresponding to the arrival of a new set of input bits X3,X2. The encoder of FIG. 3 has four delay elements and is thus a ($2^4$=) 16-state encoder.

Figure 4:
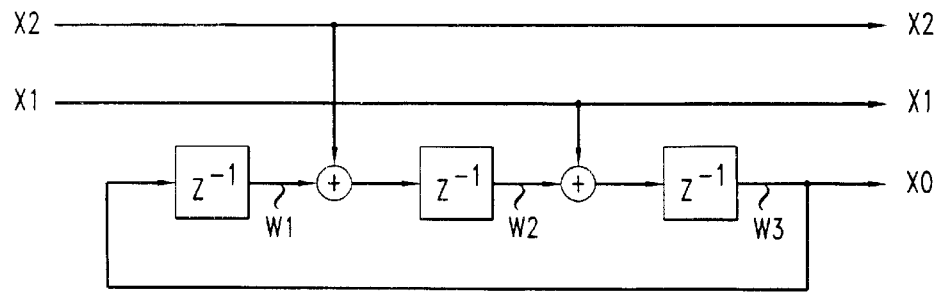

Bits X3,X2,X1 are applied to symbol interleaver 108. The presence of symbol interleaver 108 ensures that bursts of errors that may appear at an intermediate point in the decoding process at the receiver (described below) are randomized before being further processed, thereby enhancing the performance of the overall decoding process. It suffices for the present simply to note that at a subsequent point in time, the three bits X3,X2,X1 are provided together on output leads 109 of the interleaver. In particular, bits X2,X1 are provided on lead 1091 of leads 109 and bit X3 is provided on lead 1092 of leads 109. Bits X2,X1 are applied to an inner trellis encoder 110, which is an $M_2$-state, rate-⅔ encoder. Encoder 110 is also a systematic encoder, so that it provides input bits X2,X1 as two of its three output bits. The third output bit of encoder 110 is redundant bit X0. An illustrative embodiment for inner encoder 110 is shown in FIG. 4. The inner encoder of FIG. 4 is an 8-state encoder which illustratively is identical to the encoder of FIG. 2. The four bits X3,X2,X1,X0 are applied to symbol constellation mapper 112. The symbol constellation here is a 2D constellation. It proves convenient to make a notation change at this point by referring to the bits that are applied to the symbol constellation mapper using Y's rather X's. Thus bits X3,X2, X1,X0 are renamed in the FIG. as bits Y3,Y2,Y1,Y0 but are actually the same bits.

Arrangements embodying the principles of the invention utilize a signal constellation of sufficient size (i.e., number of symbols in the constellation) to accommodate the transmission of the data bits and redundant bits within a single symbol interval. In this example, the values of the four bits Y3,Y2,Y1,Y0 are used by constellation mapper 112 to select one of ($2^4$=)16 subsets of a 16-symbol signal constellation, with each subset comprising a single symbol. (In embodiment described below, each subset comprises more than one symbol and other bits are used to select a particular symbol from the identified subset.) The constellation may be, for example, the QAM constellation shown in FIG. 6 or the constant-amplitude, PSK constellation shown in FIG. 7. Illustrative mapping of bit values to symbols is shown in those FIGS. Thus in FIG. 6, for example, when the bit pattern Y3Y2Y1Y0 has the values 1101, the pattern is mapped into the symbol in the lower right-hand corner of the constellation.

The mapping meets the criterion that the value of at least one coordinate of the symbol is a function of more than one of the turbo code output bits. In other words, the values of the symbol coordinates are determined by the turbo coder output bits interdependently. In this specific example, each symbol has only two coordinates since the turbo code is a 2D turbo code. The turbo code has four output bits, so that the value of at least one coordinate is necessarily a function of more than one turbo code output bit. (Indeed, in this example, both coordinates meet this criterion.). A consequence of the aforementioned fact that the values of the symbol coordinates are determined by the turbo coder output bits interdependently is that the inter-subset minimum Euclidean distance between the two subsets identified by any two different turbo code output bit patterns is not a function of the Hamming distance between those two bit patterns. It can similarly be readily shown that the above discussion is applicable to each other turbo code disclosed herein. (Throughout this specification, the terms "minimum distance" and "minimum Euclidian distance" will be used interchangeably.)

The symbol provided at the output of symbol constellation mapper 112 at any particular time is denoted as symbol P. Symbol P is applied to conventional output circuitry 114 which generates a signal suitable for application to a transmission channel. Circuitry 114 may thus include, for example, a pulse-shaping filter and modulator. If the channel is characterized by fading or other bursty noise phenomena, circuitry 114 might also include an interleaver of known type designed to ameliorate the effects of such phenomena. (Such an interleaver is not to be confused with symbol interleaver 108.)

In combination, outer encoder 106, symbol interleaver 108 and inner encoder 110 comprise a turbo encoder. The turbo encoder is, more particularly, a serial-concatenated turbo encoder, by which is meant herein that at least some of the output bits, including at least one redundant bit, provided by the outer encoder are further processed by the inner encoder. In this example, in particular, data bit X2 and redundant bit X1 at the output of outer encoder 106 are, after interleaving, applied to inner encoder 110.

More specifically, in turbo codes embodying the principles of the invention a) the state of each of the inner and outer encoders is advanced only once per symbol interval, as previously noted, and b) all of the data bits, and at least one redundant bit generated by the encoders for that symbol interval are transmitted together during a single symbol interval. In the embodiment under discussion, then, as just described, all of the data bits (namely bits X3,X2) and, in this case, all of the redundant bits generated by both encoders (bits X1,X0) for a particular symbol interval are used to select a symbol for transmission and are thus, indeed, transmitted together. This approach provides a number of advantages which are discussed in detail at a more opportune point hereinbelow.

Turbo Encoder Interleaver

FIG. 5 is a conceptual view of an illustrative embodiment for symbol interleaver 108 useful when the outer and inner encoders are the encoders of FIG. 2 and FIG. 4, respectively. Specifically, interleaver 106 is referred to as a symbol interleaver in that the bits X3,X2,X1 are treated as an inseparable group and are represented (along with bit X0) by a particular one constellation symbol. A sequence of 196 such groups comprise a so-called interleaving frame. The input bit groups are numbered 0 to 195. The interleaver can be conceptually thought of as a storage matrix having J rows and K columns. Illustratively J=14 and K=14. (Although J=K in this example, this is not necessarily always the case.)

As the bit groups are generated by outer encoder 106 and applied to symbol interleaver 108, they are inserted in the matrix in the manner shown in FIG. 5. That is, group 0 is inserted at the row-column location 0—0, group 1 at 0–2, and so forth. After all 196 bit groups have been stored, they are read out of the interleaver column-by-column. Thus the bit group output order is 0, 28, 56, . . . 182, 7, 35, . . . 167, 195. Certain of the elements of the matrix are circled in FIG. 5 to help in the explanation of the so-called termination of the turbo code, as described below.

The bit groups are inserted into each row in accordance with a pattern in which, for the most part, successive input bit groups are separated by $K_1$ columns. Illustratively, $K_1=2$. Thus, for example, bits groups 0 and 1 are inserted into columns 0 and 2. In addition, the bit groups are inserted into each column in accordance with a pattern in which, for the most part, successive contiguous K input bit groups are separated either by $J_1$ or $(J_1-1)$ rows. For example, the first K bit groups 0 through 13 are inserted into row 0 while the second K bit groups 14 through 27 are inserted into row 7 (a separation of $J_1=7$). Then the third collection of K bit groups 28 through 41 are inserted into row 1 (separation of $(J_1-1)=6$) while the fourth collection of K bit groups 42 through 55 are inserted into row 8 (separation of $(J_1=7)$, and so on. The overall effect is that any two successive bit groups at the input of the interleaver will be separated by at least $K_1 \times J$ bit groups at the output of the interleaver and any two successive bit groups at the output of the interleaver separated by at least ( $J/J_1 \times K$) bit groups at the input of the interleaver. Although conventional column-by-column /row-by-row interleaving (which would have $J_1=K_1=1$) can be used in conjunction with the present turbo codes, an interleaver such as that shown in FIG. 5 is preferable because for a given interleaver size of J×K bit groups, the separation between successive bit groups at the input or at the output of the interleaver is greater when the FIG. 5 interleaver is used. This provides the turbo code with better performance for a given J and K, or for the same performance, allows the turbo code to use a smaller J and K, and hence have a shorter interleaving delay.

In the general case, the values used for J and K should be selected so as to match the interleaving to the turbo coding itself. In particular, J should be selected as a function of the so-called decoding depth of the inner code and K should be selected as a function of the decoding depth of the outer code. Advantageous values for J and K for various ones of the embodiments described herein are shown in Table I. Each of these embodiments may advantageously have $J_1=J/2$ and $K_1=2$, but other values for $J_1$ and $K_1$ may provide even better performance, as may be determined experimentally.

TABLE I

Figure 14:
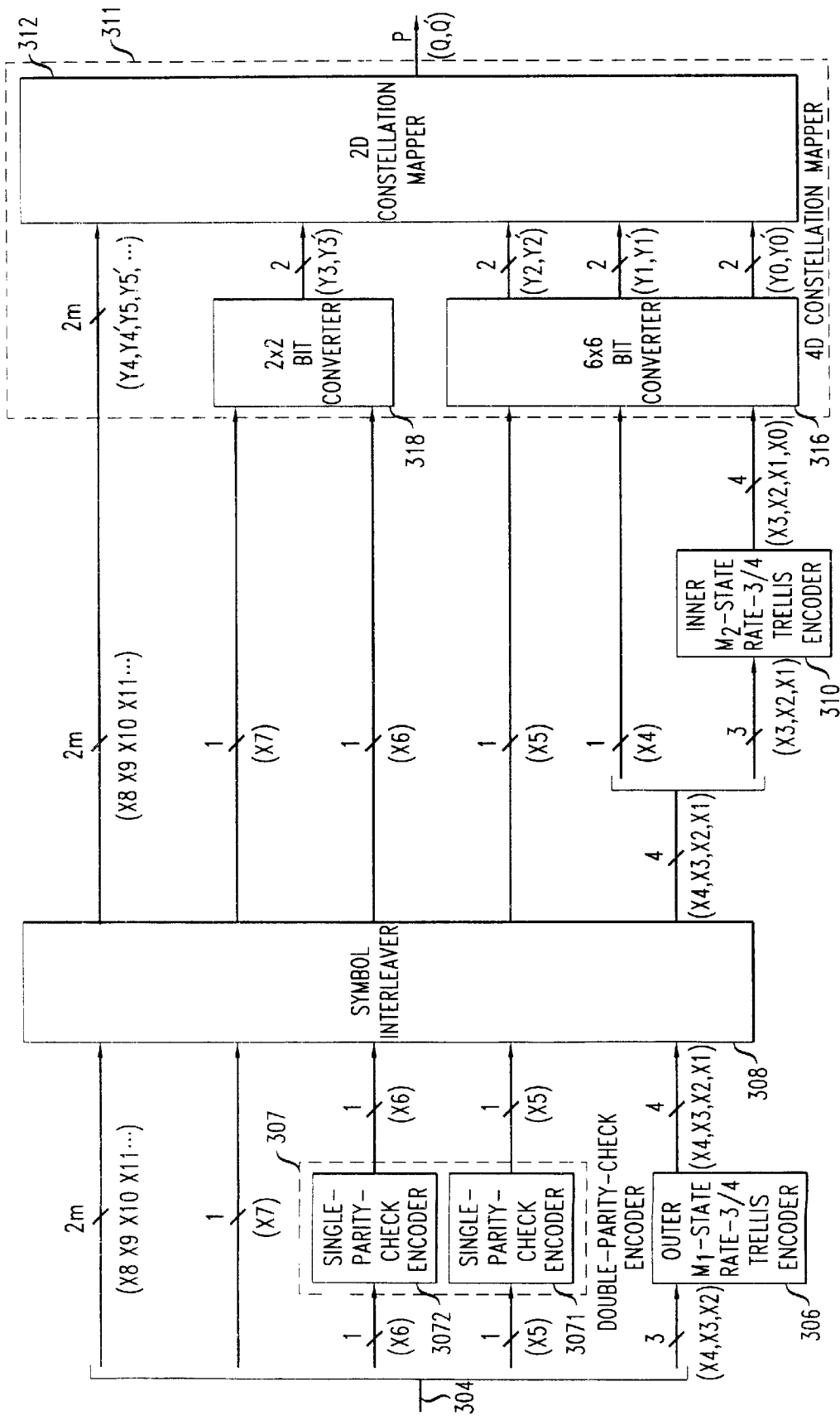
FIG. 14 is a transmitter including a further embodiment of a turbo encoder embodying the principles of the invention.
Figure 24:
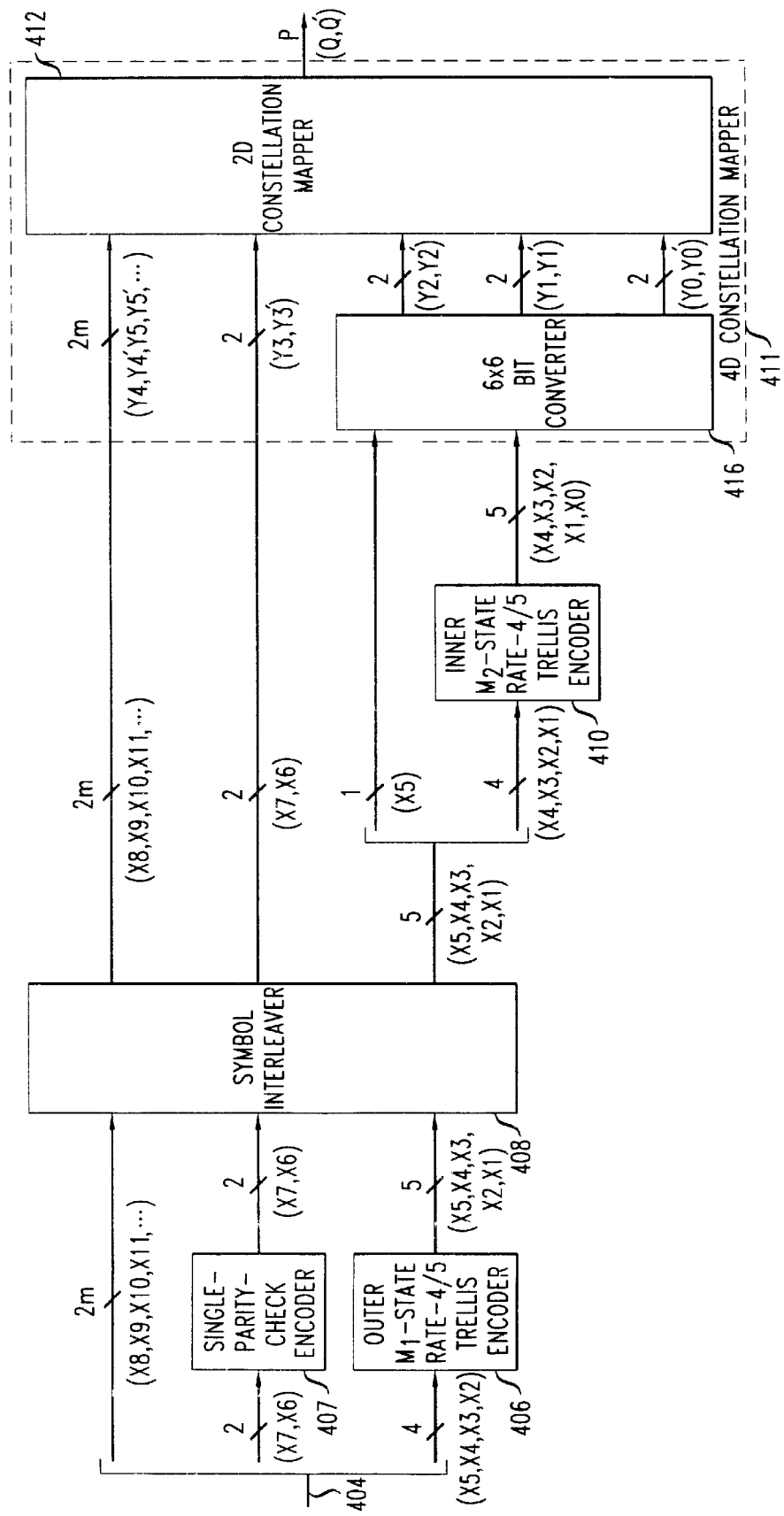
FIG. 24 is a transmitter including a further embodiment of a turbo encoder embodying the principles of the invention.
Figure 27:
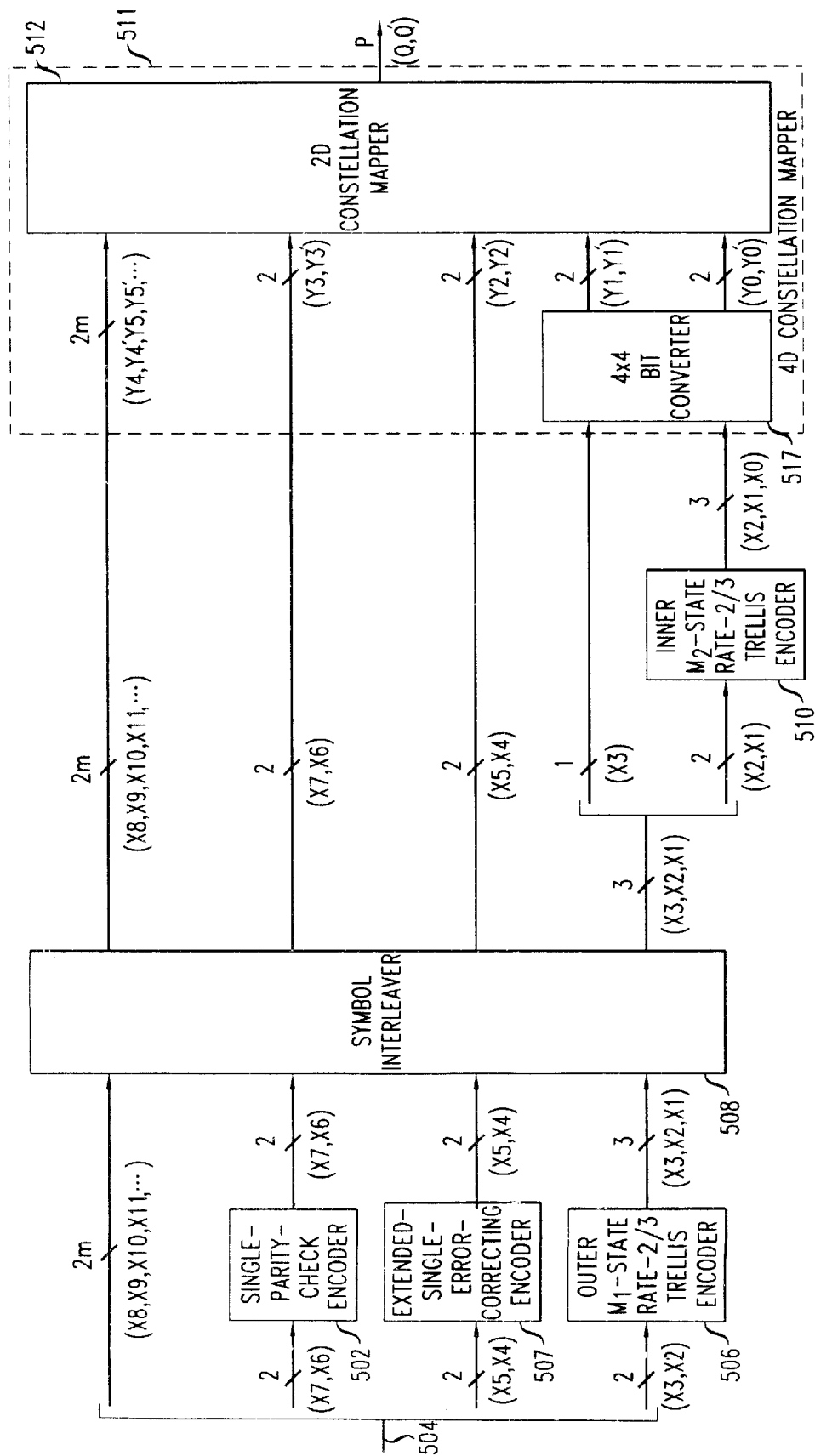
FIG. 27 is a transmitter including a further embodiment of a turbo encoder embodying the principles of the invention.
Figure 31:
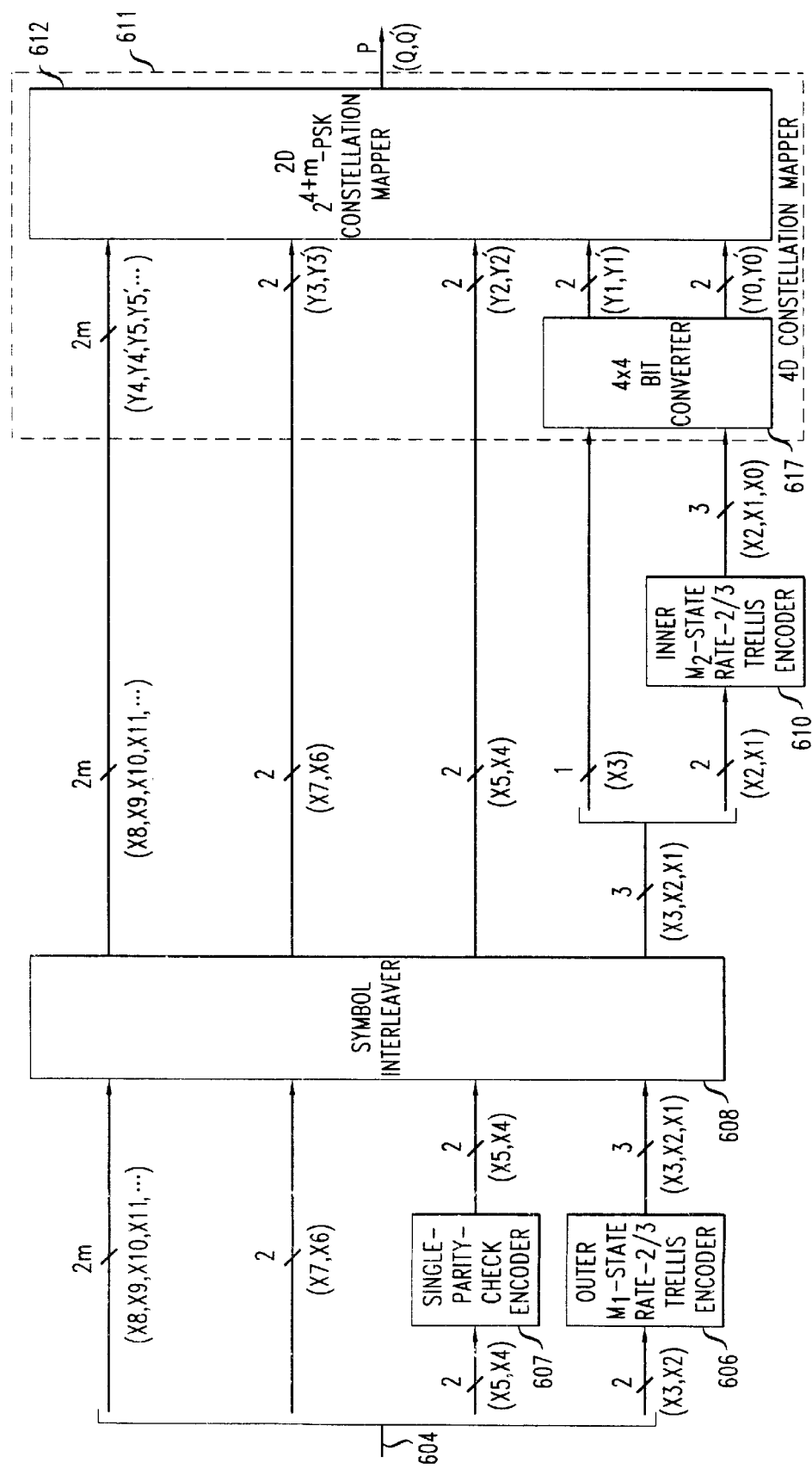
FIG. 31 is a transmitter including a further embodiment of a turbo encoder embodying the principles of the invention.

| Code | $M_1$ | $M_2$ | Constellation Type | J | K |
| --- | --- | --- | --- | --- | --- |
| FIG. 1 | 8 | 8 | QAM | 14 | 14 |
| FIG. 1 | 16 | 8 | QAM | 14 | 20 |
| FIG. 14 | 16 | 16 | QAM | 12 | 12 |
| FIG. 14 | 16 | 16 | PSK | 14 | 14 |
| FIG. 24 | 32 | 32 | QAM | 14 | 14 |
| FIG. 24 | 32 | 32 | PSK | 18 | 18 |
| FIG. 27 | 8 | 8 | QAM or PSK | 10 | 10 |
| FIG. 27 | 16 | 8 | QAM or PSK | 10 | 12 |
| FIG. 31 | 8 | 8 | PSK | 14 | 14 |
| FIG. 31 | 16 | 8 | PSK | 14 | 20 |

When the values of J and K are even integers, the operation of the symbol interleaver may be described in formal terms as follows:

The symbol interleaver reads in a block of J·K bit groups, arranges them into a J×K matrix (not on a row-by-row basis as described below), and then reads them out column-by-column with the top bit group in the leftmost column being read out first. Each bit group here comprises all the coded and uncoded bits that are carried in a symbol interval.

More precisely, let the parameters J and K of the interleaver be integral multiples of $J_1$ and $K_1$, respectively. Express the sequence number i, i=0, 1, . . . , or J·K−1, of each bit group at the input of the interleaver as $$i=\alpha_1 \cdot (J \cdot K/J_1) + \alpha_2 \cdot K + \alpha_3 \cdot (K/K_1) + \alpha_4,$$

where the coefficients $\{\alpha_q\}$ are non-negative integers, and are such that
$Z_1 \triangleq \alpha_2 \cdot K + \alpha_3 \cdot (K/K_1) + \alpha_4$ is the residue when i is divided by $J \cdot K/J_1$,
$Z_2 \triangleq \alpha_3 \cdot (K/K_1) + \alpha_4$ is the residue when $Z_1$ is divided by K, and $\alpha_4$ is the residue when $Z_2$ is divided by $K/K_1$; or equivalently, such that $\alpha_1 < J_1$, $\alpha_2 < J/J_1$, $\alpha_3 < K_1$, and $\alpha_4 < K/K_1$. The $i^{th}$ input bit group is then read out as the $j^{th}$ output bit group with $$j=\alpha_4 \cdot (J \cdot K_1) + \alpha_3 \cdot J + \alpha_2 \cdot J_1 + \alpha_1.$$

Upper Level Bits

As noted above, arrangements embodying the principles of the invention utilize a signal constellation of sufficient size to accommodate the transmission of the data bits and redundant bits within a single symbol interval. Indeed, additional bits beyond those processed by the turbo encoder can be transmitted during the symbol interval by using an appropriately larger symbol constellation. In particular, then, consider the case where, contrary to what was previously assumed, serial-to-parallel converter 105 does provide data bits on leads 1045 and 1046—specifically a single data bit (in this example) on lead 1045 and m data bits on lead 1046. These are referred to herein as the "upper level bits." In particular, bit X4 on lead 1042 is applied to single-parity-check (SPC) encoder 107 having parameters (J·K, J·K−1, 2), meaning that the code has a codeword length of J·K bits; that the first J·K−1 of those bits are input bits and the last bit is a redundant parity check bit; and that the Hamming distance of the code is 2. J and K are the aforementioned interleaver parameters J and K. Thus, for each interleaving frame of J·K (=196, in this example) symbol intervals, serial-to-parallel converter 105 provides a data bit X4 for each of the first ((J·K)−1) (=195) symbol intervals, but not for the last $196^{th}$ symbol interval. SPC encoder 107 passes each bit X4 to its output lead 1022 directly. During the $196^{th}$ symbol interval it provides on lead 1022 a parity check bit whose value is based on the ((J·K)−1) data bits. The combination of encoder 107 with the turbo encoder constitutes a so-called multi-level code. More particularly, the use of encoder 107 enables the system to take full advantage of the coding gain afforded by the turbo code, per the principles elucidated in my U.S. Pat. No. 5,258,987 issued Nov. 2, 1993. The output of encoder 107 on lead 1022 is also labeled "X4" for convenience but it will be appreciated from the above discussion that one out of every J·K of those bits is not bit X4 from lead 1022 but, rather, is the parity check bit generated from within encoder 107.

Bit X4 on lead 1022, along with the m bits X5,X6, . . . on leads 1046 are applied to symbol interleaver 108 along with bits X3,X2,X1 on lead 1021 as previously described. Illustratively, all of these bits—rather than only bits X3,X2, X1, as assumed above—are treated as an inseparable group within the interleaver. Interleaver output bits X4, on lead 1093 and bits X5,X6, . . . on leads 1094 are relabeled in the FIG. as bits Y4,Y5,Y6 . . . and are applied to constellation mapper 112 along with bits Y3,Y2,Y1,Y0 as described above.

Figures 7, 8:
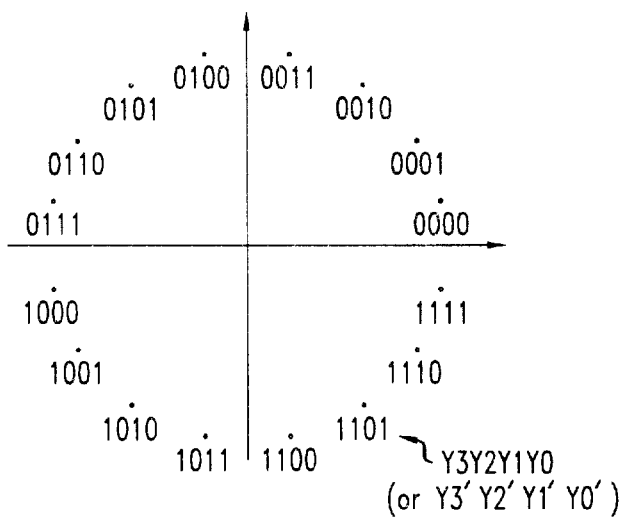

Symbol constellations and mappings for two cases are shown in FIGS. 8 and 9. FIG. 8 is a ($2^6$=) 64-symbol constellation, the 6 bits that are represented by each symbol being bits Y5,Y4,Y3,Y2,Y1,Y0. That is, this is a case for which m=1. FIG. 9 is a 256-symbol constellation that can be used when m=3. In FIG. 9, only the mapping of bits Y4,Y3,Y2,Y1,Y0 is shown for drawing simplicity. That is, each 5-bit pattern Y4Y3Y2Y1Y0 is associated with eight different symbols in the constellation. Also for drawing simplicity, the decimal equivalent of each binary bit pattern, rather than the binary bit pattern itself, is shown. The selection of a particular one of the eight symbols associated with each decimal equivalent of a particular 5-bit pattern is determined by the values of the m (=3) bits Y7,Y6,Y5 on lead 1094. Thus, as shown by way of example in FIG. 9, the bit pattern Y7Y6Y5Y4Y3Y2Y1Y0=11010101 identifies one of the eight symbols labeled "21" in the FIG. (binary 10101=decimal 21) and the bit pattern 11110101 identifies another one of those eight symbols. The non-rectangular shape of the FIG. 9 constellation advantageously reduces the peak-to-average power ratio of the transmitted signal as compared to, for example, a 16×16 rectangular constellation. Moreover, it provides a small amount of so-called shaping gain.

Based on the foregoing, and with careful consideration of, for example, FIG. 9, it will be appreciated that bits Y3,Y2,Y1,Y0, i.e., the turbo encoder output bits identify one of 16 subsets of the overall constellation—each subset comprising sixteen symbols—and that bits Y7,Y6,Y5,Y4 select a particular symbol from the identified subset. The partitioning of the overall constellation into the 16 subsets is done in such a way that the minimum distance between the symbols in each subset (the so-called intra-subset minimum distance) is maximized. If encoder 107 were not present, then the mapping between bits Y7,Y6,Y5,Y4 and the symbols of each subset could be random. However, in order to realize the benefit to the overall code of the presence of encoder 107, that mapping cannot be random. Rather, bit Y4 should be used to identify a refined eight-symbol subset of the subset identified by the turbo code output bits Y3,Y2,Y1,Y0. The partitioning of each 16-symbol subset should be done in such a way that the intra-subset minimum distance of each eight-symbol refined subset (identified by a particular decimal number as previously described) is maximized. A random mapping can then be used to use bits Y7,Y6, Y5 to select one of the eight symbols of the identified refined subset.

Turbo Decoder

Figure 10:
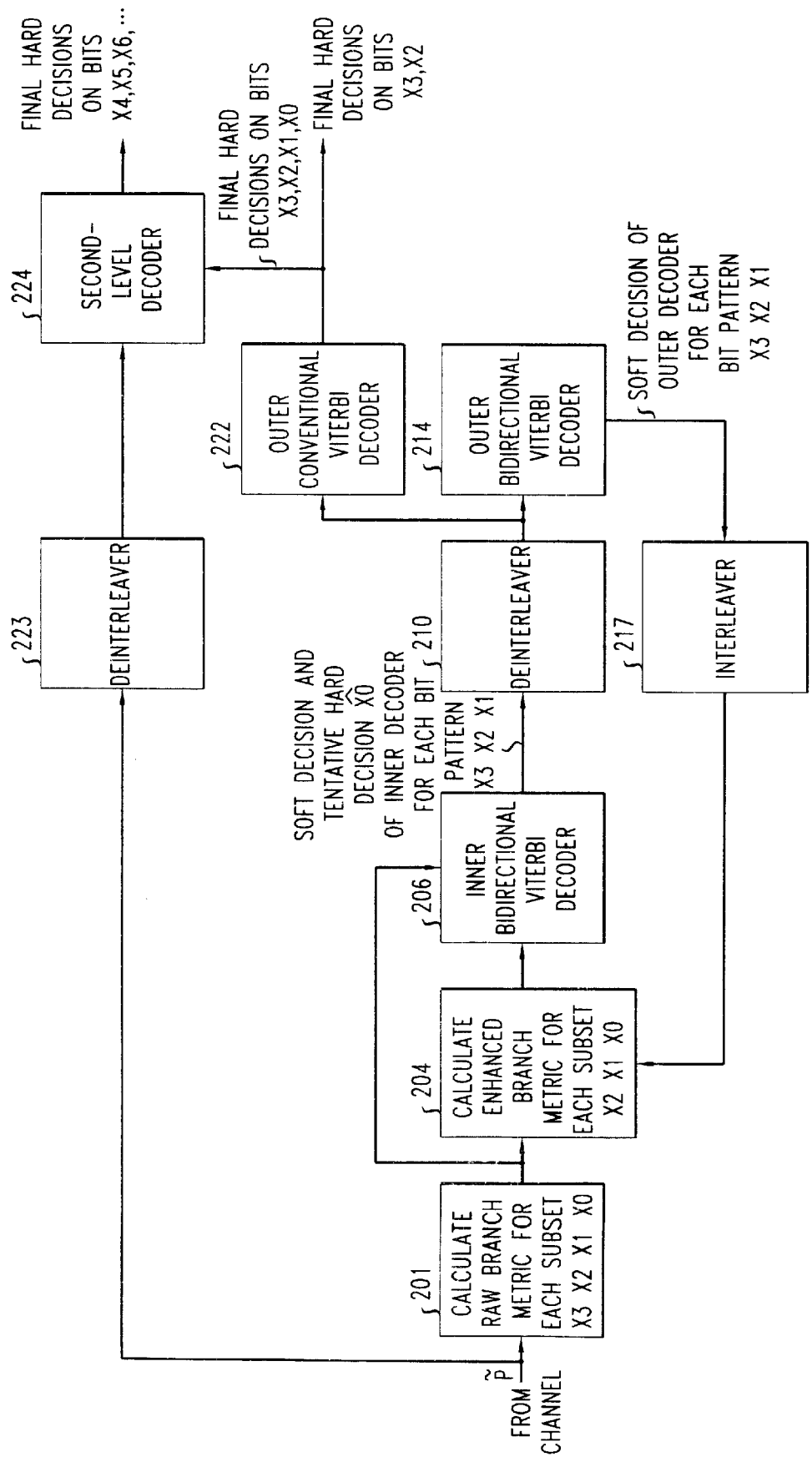
FIG. 10 is a receiver including an illustrative turbo decoder for decoding the turbo-encoded signal.

FIG. 10 is a block diagram of a receiver which includes a turbo decoder for decoding the symbols transmitted by the transmitter of FIG. 1, as well as the other transmitters disclosed herein. The overall architecture of the decoder is similar to turbo decoders known in the art. See, for example, Hagenauer et al, "Iterative decoding of binary block and convolutional codes," IEEE Trans. Inform. Theory, vol. 42, pp. 429–445, 1996. An overview of the operation of the turbo encoder will first be presented, followed by a more detailed description thereof.

At the heart of the decoder are two bidirectional Viterbi decoders-an inner decoder 206 and an outer decoder 214.

Each bidirectional decoder is modified, per the discussion below, from that shown in A. Viterbi, "An intuitive justification and a simplified implementation of the MAP decoder for convolutional codes," IEEE J. Select. Areas Commun., vol. 16, pp. 260–264, February 1998. For each of the J·K received channel-corrupted symbols $\tilde{P}$ of a particular interleaving frame, block 201 calculates a raw branch metric for the subset of symbols of the constellation identified by each bit pattern X3X2X1X0. In the first iteration of the decoding process (the iterative nature of the decoding will be described just below), block 204 then calculates, for each received symbol $\tilde{P}$, an enhanced branch metric for the subset of symbols of the constellation identified by each bit pattern X2X1X0, without any input from interleaver 217. Both the frames of raw and enhanced branch metrics are then applied to decoder 206. Decoder 206 thereupon generates for each received symbol $\tilde{P}$ eight so-called soft decisions—one for each possible bit pattern X3X2X1. Each soft decision for a pattern is an estimation of a parameter related to the probability that that bit pattern was the one actually transmitted. The frame of soft decisions is deinterleaved by deinterleaver 210, which performs the inverse operation of symbol interleaver 108 in the transmitter, but rather than operating on groups of bits, operates on groups each consisting of 8 soft decisions, each decision being associated with a particular bit pattern, those 8 soft decisions being treated as an indivisible entity for deinterleaving purposes. The deinterleaved frame of soft decisions is then applied to outer decoder 214, which in turn generates, for each received symbol $\tilde{P}$, its own eight soft decisions for each of the bit patterns X3X2X1. Each soft decision generated by decoder 214 is its own estimation of the aforementioned parameter.

The process then iterates. In particular, the soft decisions generated by decoder 206 are re-interleaved by interleaver 217, which performs the inverse function to deinterleaver 210. The frame of reinterleaved soft decisions are then combined with the frame of raw branch metrics generated at block 201 to generate a frame of enhanced branch metrics at block 204. These are then used by decoder 206 to generate another frame of soft decisions which improves those generated by decoder 206 in the previous iteration.

The process continues in this way for a number of iterations. For a while, the soft decisions continue to improve but the degree of improvement provided at each iteration eventually becomes very small. Accordingly, one of two strategies may be employed. One is to monitor the process and to terminate the decoding process once the point of diminishing returns has been reached. Another approach is to simply utilize a predetermined number of iterations such as 4.

The generation of final hard decisions as to the values of the bits X3,X2,X1,X0 in the last iteration of the decoding process is illustratively accomplished by applying the frame of deinterleaved soft decisions for bit patterns X3X2X1 that were output by deinterleaver 210, along with a tentative hard decision $\hat{X0}$ as to redundant bit X0 generated for each bit pattern X3X2X1 as described below to a conventional unidirectional outer Viterbi decoder 222. (Rather than utilizing Viterbi decoder 222, decoder 214 may be used. In this case, final hard decisions may be generated by adding the input and output of outer bidirectional Viterbi decoder 214 for each bit pattern X3X2X1. The bit pattern that corresponds to the minimum of the resulting sums, along with its associated tentative hard decision $\hat{X0}$, can be used as the final hard decisions on the bits X3,X2,X1,X0). In applications not utilizing multilevel coding, i.e., X3 and X2 are the only data bits, it is sufficient for decoder 222 to simply output hard decisions as to those two bits. However, where multilevel coding is used, then Viterbi decoder 222 outputs its hard decisions as to X3,X2,X1,X0 to second-level decoder 224. Decoder 224 is illustratively a two-state Viterbi decoder of conventional design for decoding a single-parity-check code. The bits thus provided to second-level decoder 224 identify the constellation subset to which the transmitted symbol belongs. Based upon knowing the constellation subset, decoder 224 can thereupon operate on the received symbol $\tilde{P}$, after deinterleaving by deinterleaver 223, to identify the particular transmitted symbol of the identified subset and thereby provide hard decisions as to the value of bit X4 as well as the m uncoded bits, if any.

Figure 11:
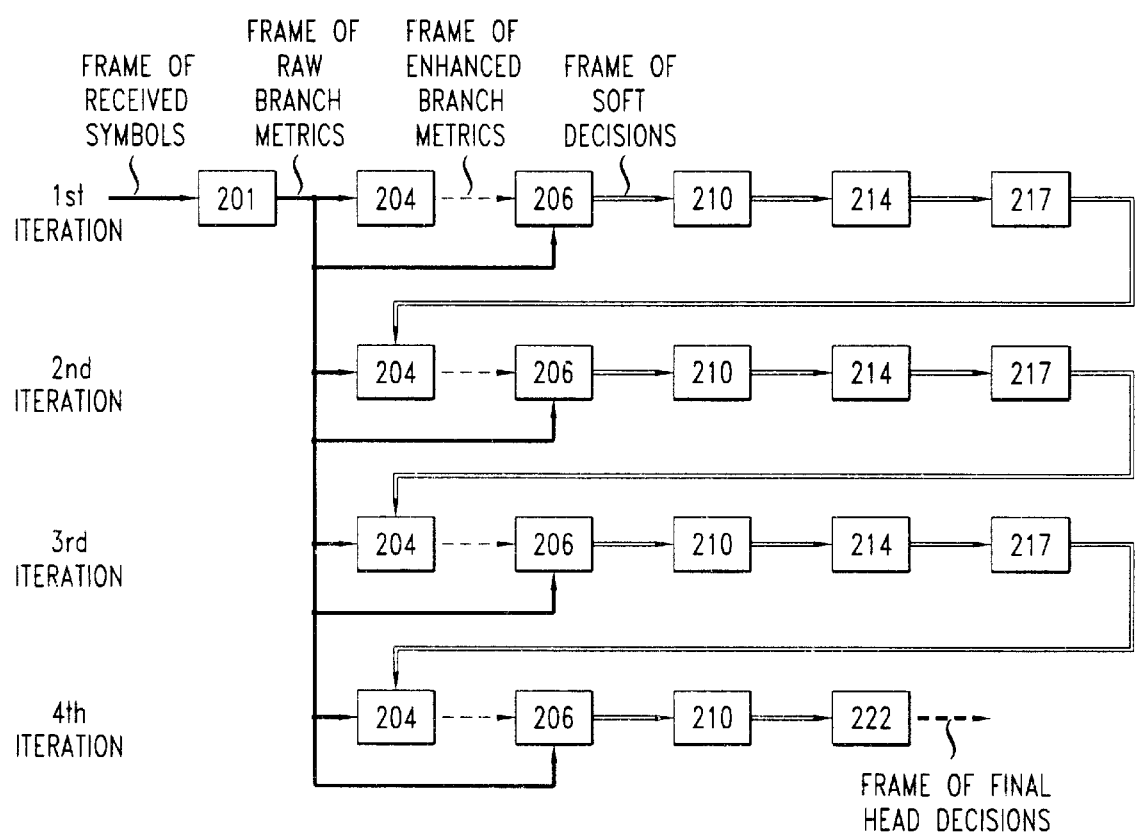
FIGS. 11–13 are drawings helpful in explaining the operation of the turbo decoder.

The frame-by-frame iterative process just described is shown schematically in FIG. 11. In particular, in the first iteration, the received symbols $\tilde{P}$ of a particular interleaving frame are applied to block 201 where the raw branch metrics are calculated. The latter are then applied to block 204 where the enhanced branch metrics are calculated. Both the new and enhanced branch metrics are next applied to decoder 206 which generates the first frame of soft decisions, which then pass on to deinterleaver 210 and decoder 214 and interleaver 217 to start off the second iteration. At this point, the frame of soft decisions from interleaver 217 are combined at block 204 with the original raw branch metrics from block 201 to provide enhanced branch metrics that are applied to decoder 206, deinterleaver 210, and so forth until, during the final, forth iteration, the frame of soft decisions that are output by deinterleaver 210 are provided to conventional Viterbi decoder 222 which generates the final decisions.

We now describe in more detail the functionalities of each of the blocks shown in FIG. 10.

As indicated in the FIG. block 201 calculates, for each received channel-corrupted symbol $\tilde{P}$, the aforementioned "raw" branch metric for each of the 16 constellation subsets associated with the 16 values of the bit pattern X3X2X1X0. This is simply the squared Euclidian distance between the received symbol and the closest symbol in that subset. The resulting raw branch metrics are supplied both to block 204 and inner decoder 206.

For each symbol, block 204 generates an enhanced branch metric for each subset associated with the 8 bit patterns X2X1X0. It does this by first adding to the raw branch metric associated with each bit pattern X3X2X1X0 the corresponding soft decision for the bit pattern X3X2X1 that was formed by outer decoder 214 and supplied to block 204 from interleaver 217. Sixteen internal enhanced branch metrics are thus formed. These are reduced to 8 enhanced branch metrics, one for each bit pattern X2X1X0, by retaining the smaller one of the two internal enhanced branch metrics for the four-bit bit pattern 0X2X1X0 and the four-bit bit pattern 1X1X0 and discarding the other. The eight enhanced branch metrics are supplied to decoder 206.

Decoders 206 and 214 operate in a generally similar manner. However, the operation of decoder 206 is a bit more involved. To help in the explanation, therefore, the operation of decoder 214 will be described first.

Figure 12:
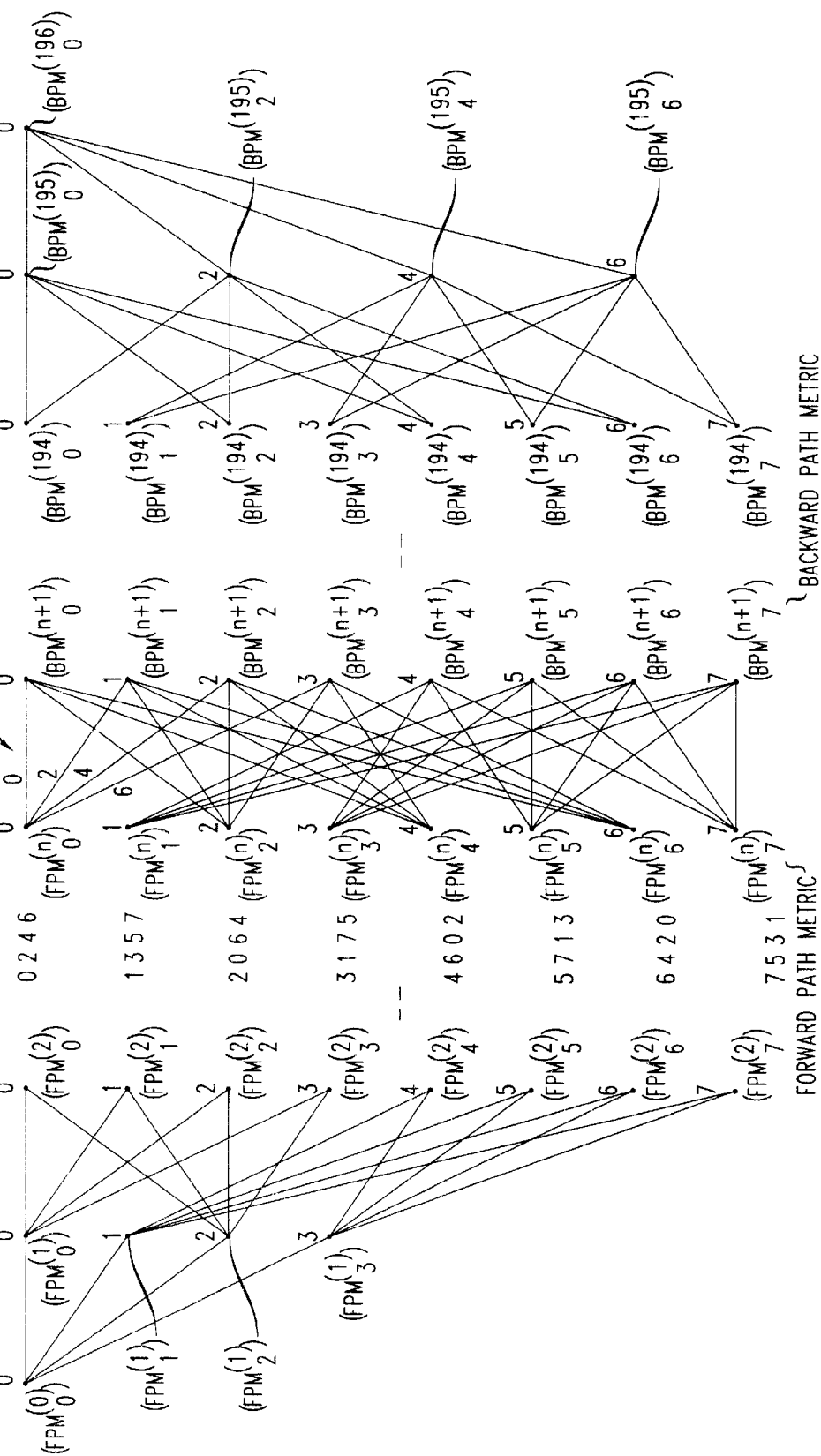

The soft decisions for the bit patterns X3X2X1 from the inner decoder are used by decoder 214 as its branch metrics. Decoder 214 uses those branch metrics in a way which follows a general approach known in the art in which path metric computation proceeds in both a forward and backward direction, as depicted symbolically in FIG. 12. In the forward direction, the decoding proceeds from a known beginning state in accordance with conventional Viterbi decoder operation. Thus, for each $n^{th}$ symbol interval of an interleaver frame, the decoder calculates and saves a set of eight "forward" path metrics $\{FPM_i^{(n+1)}, i=0,1,\ldots,7\}$—one for each encoder state of the 8-state code of FIG. 2—by processing the path metrics and branch metrics at each, illustratively, decoding stage in the conventional way. (In contrast to typical conventional Viterbi decoding, the path metrics at each decoding stage many be retained in memory. This will help minimize processing time during the soft decision generation described below.) FIG. 12 shows the eight forward path metrics associated with the $n^{th}$ symbol interval of the interleaving frame. In the backward direction, the process is the same, except that the decoding proceeds from a known ending state, resulting in a set of eight "backward" path metrics $\{BPM_i^{(n)}, i=0,1,\ldots,7\}$. (In this embodiment, the ending state is known because the turbo code is "terminated," as described below.) FIG. 12 shows the eight backward path metrics associated with the $n^{th}$ symbol interval. To simplify this discussion, it will be assumed that all of the backward path metrics are also saved in memory as they are generated.

The soft decisions for the $n^{th}$ symbol interval are calculated by processing the forward path metrics $FPM_i^{(n)}$ and the backward path metrics $BPM_i^{(n+1)}$. Each of the four trellis branches emanating from a state of the trellis is associated with a particular subset identified by a particular bit pattern X3X2X1. The decimal equivalent of the four bit patterns are shown in the column labelled "subset X3X2X1." Thus the four trellis branches emanating from state 0 are associated with the bit patterns whose decimal equivalents are 0,2,4,6, etc.; the four trellis branches emanating from state 1 are associated with the bit patterns whose decimal equivalents are 1,3,5,7; etc. At the same time, for each subset identified by a particular bit pattern X3X2X1 there are four trellis branches connecting a "current" encoder state with a "next" encoder state. The four branches for subset 0, i.e., the subset associated with the bit pattern 000, are those connecting current state/next state pairs 0-0, 2-1, 4-2 and 6-3. The forward and backward path metrics associated with each branch are separately added, yielding four sums. The soft decision for any given bit pattern is then calculated as a function of those four sums. Illustratively, that function is simply to take the minimum of the four sums as the soft decision. There is actually no need to save all the backward path metrics. The reason is that the backward path metrics can be generated after all the forward path metrics have been generated and saved. Each set of backward path metrics is used to form soft decisions as soon as that set of backward path metrics has been generated and it will no longer be needed.

The decoding carried out by inner decoder 206 is more complex. This is because, on the one hand, decoder 214 requires from decoder 206 soft decisions as to bit pattern X3X2X1 while, on the other hand, bit X3 is not processed by the inner encoder and therefore decoder 206 would have no basis on which to provide any information that involves bit X3 if its decoding algorithm were to be the same as carried out by decoder 214.

Inner decoder 206's processing is, similar to the processing carried out by decoder 214 in the first instance. However, that processing includes a further aspect which enables it to provide that which outer decoder 214 requires—soft decisions involving bit X3 and, more particularly, soft decisions as to the bit pattern X3X2X1.

In particular, inner decoder 206 for, illustratively, the 8-state code of FIG. 4, initially uses as its branch metrics the enhanced branch metrics for bit pattern X2X1X0 generated by block 204, as previously described, to generate forward and backward path metrics in just the same way as was done in outer decoder 214. (It should be noted that if the inner and outer codes are not the same, a different trellis will be used by the inner and outer decoders in generating the path metrics, but the computational approach is otherwise the same.) And also as in decoder 214, soft decisions are thereafter made as to the bit patterns X2X1X0. In the case of decoder 214, such soft decisions constitute the decoder output. Here, however, as just noted, soft decisions as to X2X1X0 are not what is needed by decoder 214. Thus the soft decisions generated within decoder 206 cannot be used as that decoder's output. Rather, further processing is needed in order to allow decoder 206 to provide soft decisions as to X3X2X1.

To this end, decoder 206 next generates an internal soft decision for the bit pattern X3X2X1X0 by adding the raw branch metric for that pattern to the soft decision for the bit pattern X2X1X0 just calculated. There are two such internal soft decisions associated with the bit pattern X3X2X1— namely the internal soft decisions for the two bit patterns X3X2X1X0 in which X3X2X1 has a particular value but X0 is either 0 or 1. The smaller of the two internal soft decisions is then used as the soft decision for the bit pattern X3X2X1. In addition, the particular value of X0 associated with the smaller internal soft decision is used as the aforementioned tentative hard decision $\hat{X}0$ for the corresponding bit pattern X3X2X1.

Figure 13:
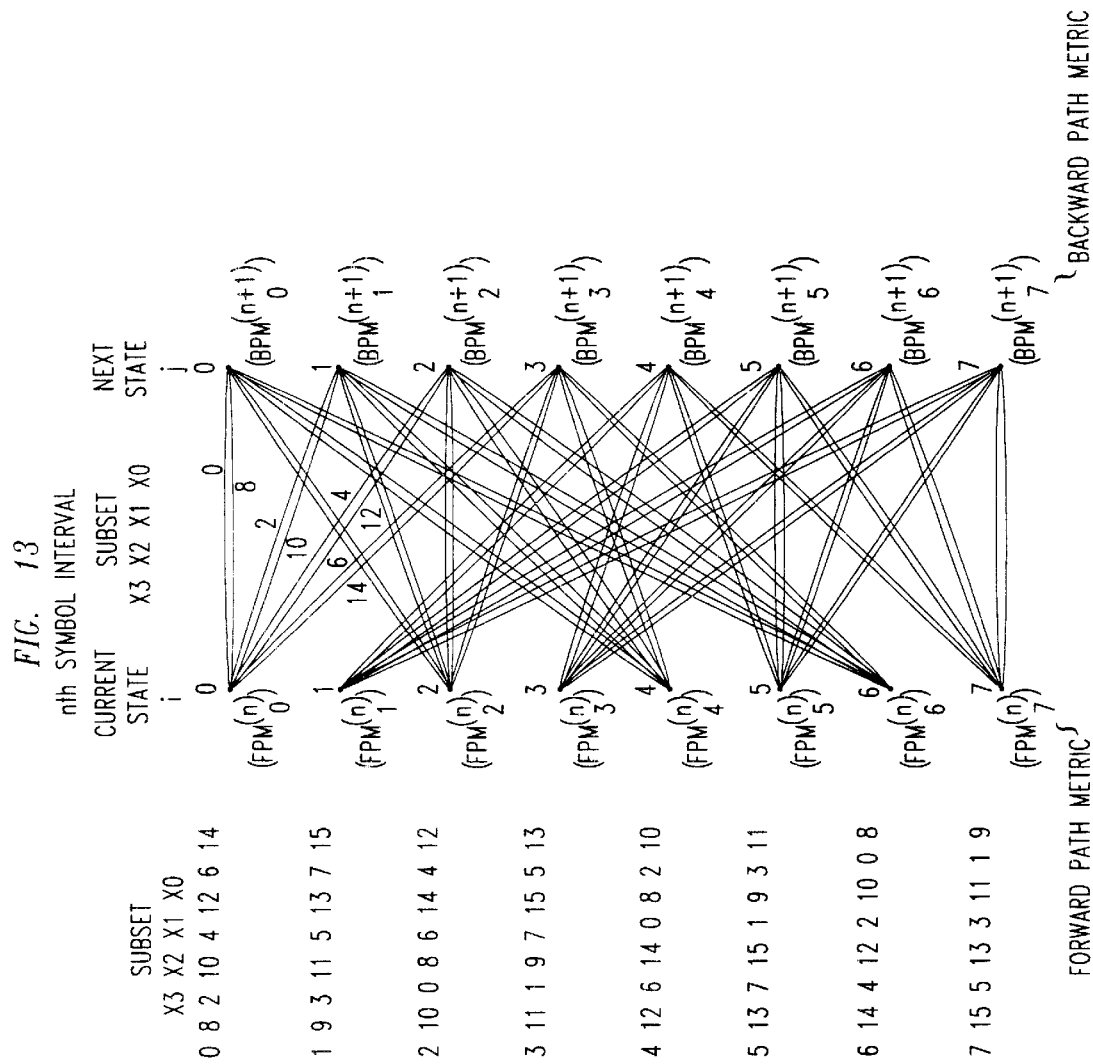

The reason that this approach works can be understood from a consideration of FIG. 13. That FIG. shows the trellis used by the inner encoder but with each branch replaced by two so-called parallel branches. The two branches for current state/next state pair 0-0, for example, are associated with refined subsets, identified by the bit patterns X3X2X1X0=0 and 8. In this "expanded" trellis diagram, there are four branches associated with each bit pattern X3X2X1X0. The best internal soft decision is associated with one of those four branches. More particularly, that best internal soft decision is the one contained in the path which has the smallest overall path metric and, indeed, the computation just described identifies that best path. Note that the expanded trellis diagram is only used to calculate the soft decisions. For calculating the forward and backward path metrics, the original non-expanded trellis diagram should be used.

Rather than simply looking at the smallest of the forward-plus-backward path metric sums in both of the decoders, a more sophisticated (albeit more complex) approach can be used, which provides better performance for at least additive white Gaussian noise channels. That approach is to generate the soft decisions in accordance with the following calculation for the outer decoder Soft Decision of Outer Decoder for Bit Pattern $$X3X2X1 = -\ln\left[\sum_{i=0}^{7}\sum_{j=0}^{7}e^{\left(-FPM_i^{(n)}-BPM_j^{(n+1)}\right)}\right],$$

where the summation is carried out for all i and j such that subset X3X2X1 is associated with the transition from current state i to next state j.

The soft decisions of the inner decoder are calculated in accordance with the following formula:

$$A(X2X1X0) \triangleq \sum_{i=0}^{7}\sum_{j=0}^{7}e^{\left(-FPM_i^{(n)}-BPM_j^{(n+1)}\right)}$$

where the summation is carried out for all i and j, such that subset X2X1X0 is associated with the transition from current state i to next state j.

$$B(X3X2X1X0) \triangleq A(X2X1X0) \cdot e^{-RBM_{X3X2X1X0}}$$

where $RBM_{X3X2X1X0}$ is the raw branch metric for subset X3X2X1X0.

Soft Decision of Inner Decoder for Bit Pattern $$X3X2X1 = -\ln\left[\sum_{X0=0}^{1}B(X3X2X1X0)\right]$$

in which case the aforementioned tentative hard decisions for $\hat{X}0$ would be generated in accordance with the following calculation:

Hard Decision $\hat{X}0$ of Inner Decoder for Bit Pattern $$X3X2X1 = \begin{cases} 0, & \text{if } B(X3X2X10) > B(X3X2X11) \\ 1, & \text{otherwise} \end{cases}$$

The above discussion is principally presented on the assumption that the inner and outer trellis codes are both 8-state codes. However, straightforward extension of the processing described hereinabove for 8-state codes will allow codes with other numbers of states to be accommodated.

The above discussion also principally presented on the assumption that the inner and outer trellis codes are both rate-$\frac{2}{3}$ codes. Other rate codes, however, can be accommodated straightforwardly. For example, in the case of a rate-$\frac{3}{4}$ code, then element 201 will operate based on subsets associated with the various bit patterns X4X3X2X1X0 rather than X3X2X1X0; element 204 will operate based on subsets associated with the various bit patterns X3X2X1X0 rather than X2X1X0; and soft decisions from the inner and outer bidirectional Viterbi decoders 206 and 214 will be made for bit patterns X4X3X2X1 instead of X3X2X1. Similarly, decoder 222 will output final hard decisions on bits X4,X3, X2 rather than X3,X2 and will output final hard decisions on bits X4,X3,X2,X1,X0 rather than X3,X2,X1,X0 to the second-level decoder 224. The above expressions for computing the soft decisions would, analogously, include consideration of bit X4. Moreover, in the case of a rate-$\frac{4}{5}$ code, the various elements of the decoder, as well as the expressions for computing the soft decisions, would analogously, also take bit X5 into account.

Other Turbo Codes

Other turbo codes implementing the principles of the present invention will now be described. In order to make reference to different turbo codes easier, it is convenient to define a "rate" for the turbo code, as contrasted with the rate of its constituent inner and outer codes. In particular, the rate of a turbo code can be defined as k/(k+r) where k is the number of data bits applied to the outer code for each symbol interval and r is the total number of redundant bits generated by both the inner and outer codes in each symbol interval. The turbo code of FIG. 1 is thus a rate-$\frac{2}{4}$ turbo code.

FIG. 14, in particular shows a transmitter having an architecture that is generally similar to that of FIG. 1. This transmitter employs a four-dimensional (4D) serial-concatenated rate-⅗ turbo code. The code here is four-dimensional code because each symbol P is comprised of two 2D signal points whose values are determined in response to a single advance of the state of the turbo code—that is, the states of the inner and outer coders advance only once for each 4D symbol interval. Thus as indicated in FIG. 14 each 4D symbol P is comprised of two 2D signal points Q and Q'.

Figure 15:
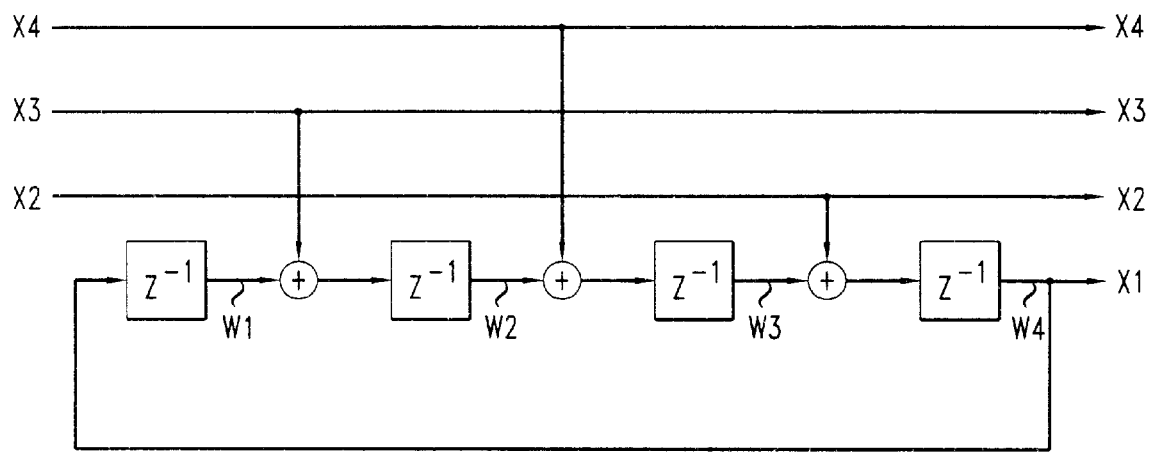
FIGS. 15 and 16 are illustrative embodiments of inner and outer encoders that can be used in the turbo encoder of FIG. 14.
Figure 16:
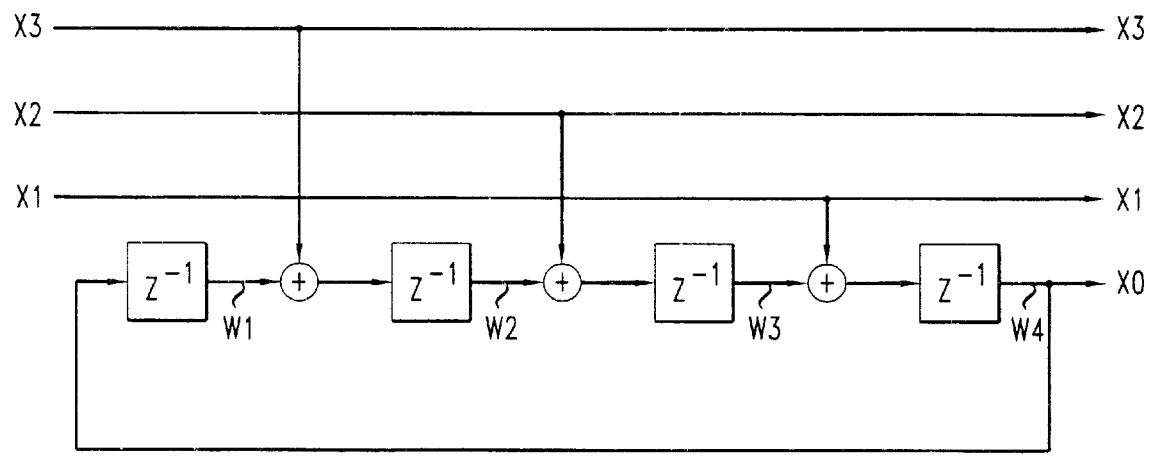
Figures 18, 19:
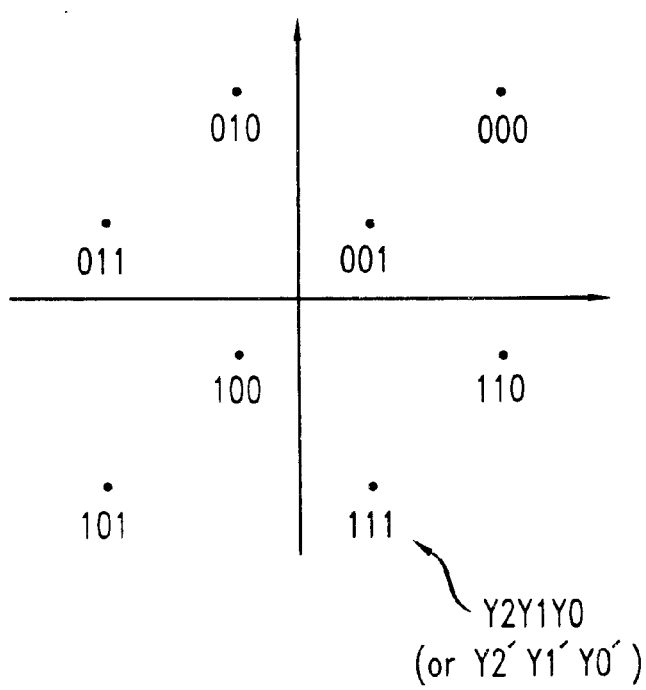
Figure 20:
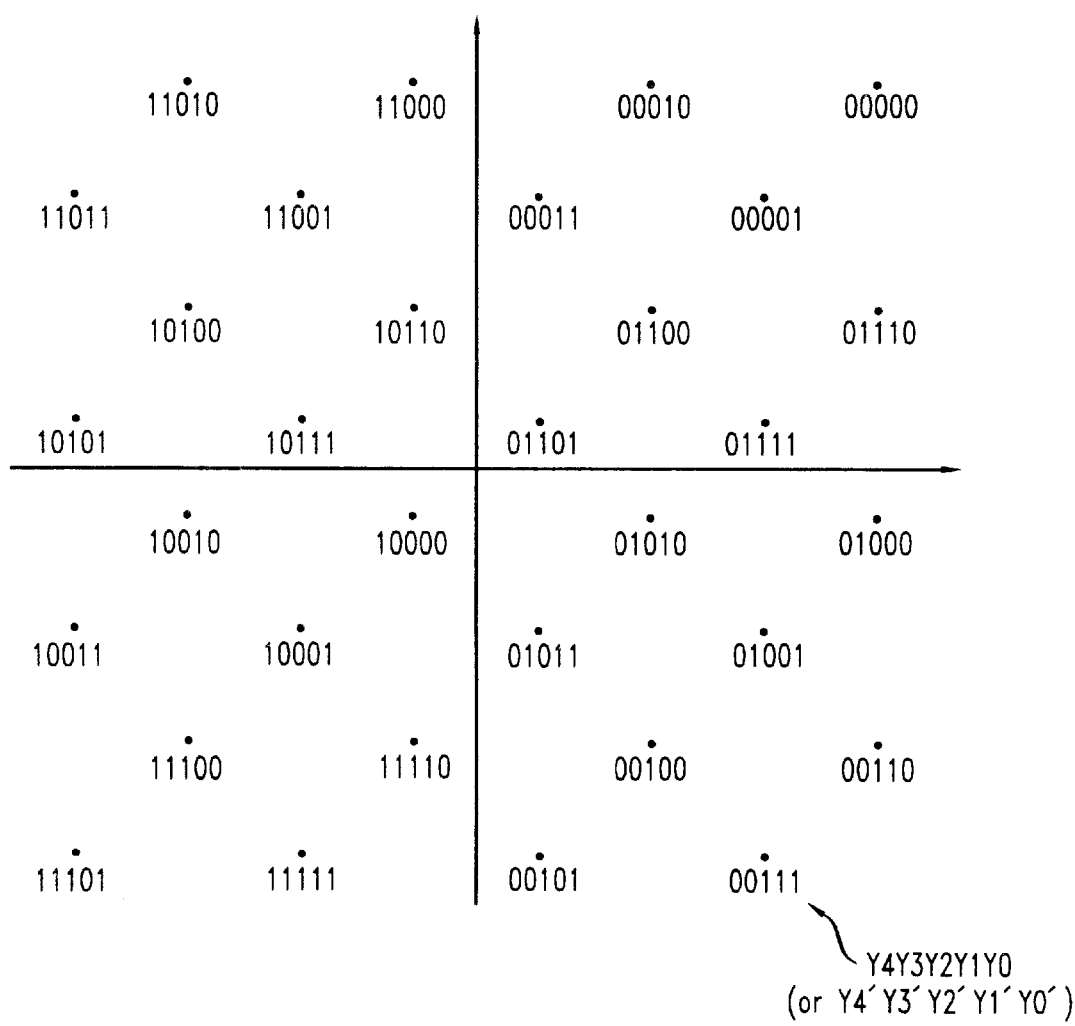
Figure 25:
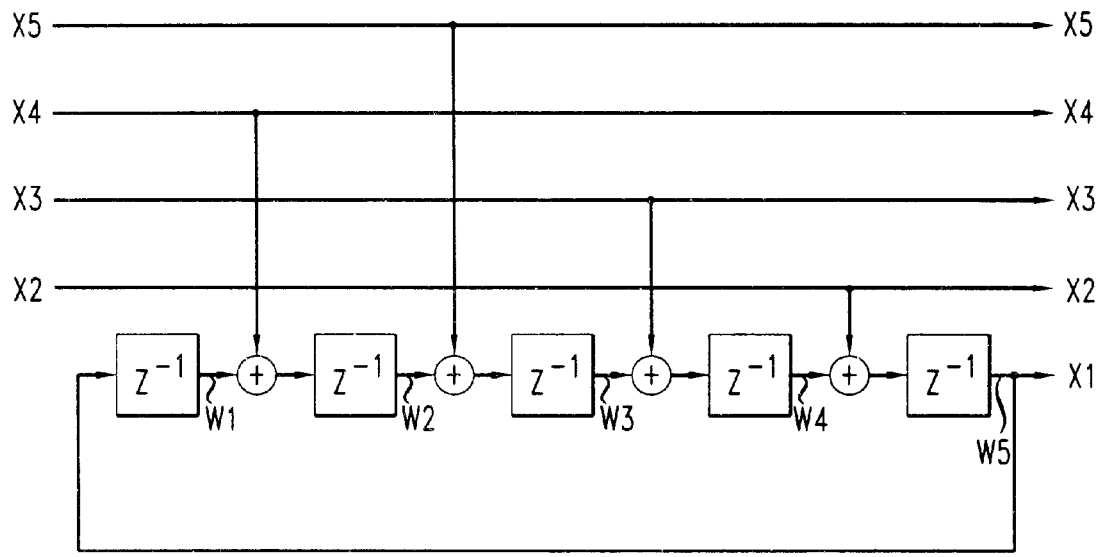
FIGS. 25 and 26 are illustrative embodiments of inner and outer encoders that can be used in the turbo encoder of FIG. 24.
Figure 26:
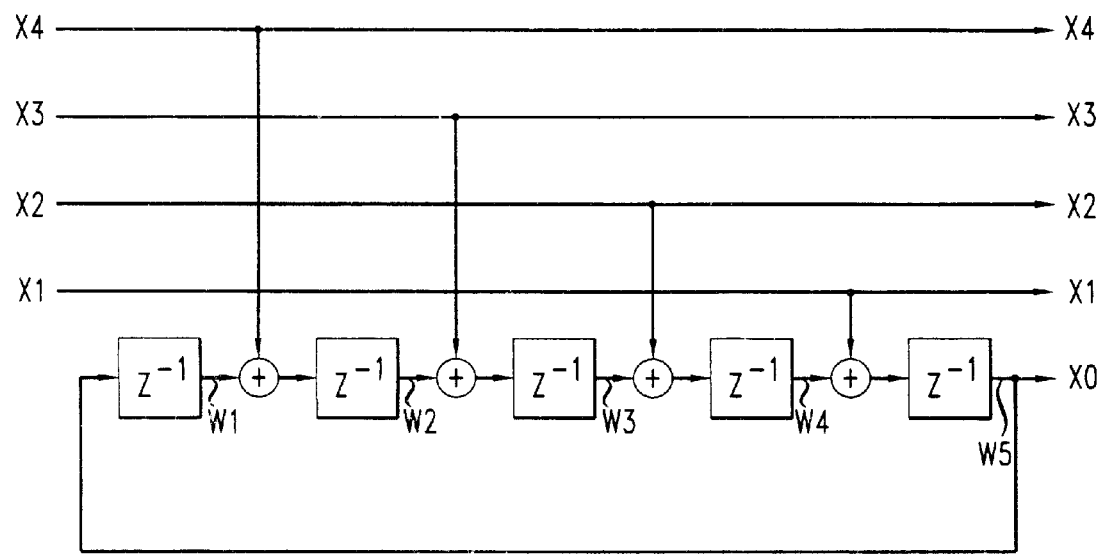

At the coder input, then, (6+2 m) bits are provided from a serial-to-parallel converter (not shown) on lead 304 for each 4D symbol interval. Three of those bits are applied to $M_1$-state, rate-¾ outer trellis encoder 306 and two of those bits are applied to double-parity-check encoder 307. The latter actually comprises two single-parity-check encoders 3071 and 3072 each of which receives a respective one of input bits X5 and X6. Encoders 3071 and 3072 are illustratively identical to encoder 107 previously described. The remaining (1+2 m) bits X7,X8 . . . are uncoded. Outer encoder 306 is illustratively the 16-state encoder shown in FIG. 15. The resulting (7+2 m) bits are applied to symbol interleaver 308 which is generally similar to symbol interleaver 108 and, as such, treats the (7+2 m) bits as an inseparable unit for interleaving purposes. For each group of (7+2 m) bits output by interleaver 308, the three bits X3,X2,X1 are applied to $M_2$-state, rate-¾ inner trellis encoder 310. Inner encoder 310 is illustratively the 16-state encoder shown in FIG. 16. The bits X3,X2,X1,X0, along with bits X4, X5, etc provided by interleaver 308 are mapped into four-dimensional symbols by 4D constellation mapper 311. This mapping could be done directly using a single look-up table, for example. Implementational complexity is significantly reduced, however, by using those bits to separately identify the two constituent two-dimensional signal points of each four-dimensional symbol. To this end, 4D constellation mapper 311 includes 6×6 bit converter 316 which receives bits X0 through X5 and 2×2 bit converter 318 which receives bits X6 and X7. Each 4D symbol interval is comprised of two 2D signaling intervals. For the first (second) 2D signaling interval, converter 316 generates bits Y2Y1Y0 (Y2'Y1'Y0') per the bit conversion table shown in FIG. 17 while converter 318 generates bit Y3 (Y3') per the bit conversion table shown in FIG. 18. Half of the remaining 2 m uncoded bits X8, X9 etc are renamed as Y4, Y5, etc and the other half as Y4', Y5', etc. Bits Y3,Y2,Y1,Y0, along with bits Y4, Y5 etc are used by 2D constellation mapper 312 to output the first two-dimensional signal point Q and bits Y3'Y2'Y1'Y0', along with bits Y4', Y5' etc are used by constellation mapper 312 to output the second two-dimensional signal point Q'. Various mappings of the constellation mapper input bits into 2D signal points are possible, depending on how many data bits are actually to be transmitted. Three examples are depicted in the drawing. For example, if there are four data bits X2 through X5 on lead 304 (i.e., encoder 307 only includes encoder 3071), then constellation mapper 312 will be presented with 3 bits per 2D signaling interval, i.e., Y2Y1Y0 for the first 2D signaling interval of each 4D symbol interval and Y2'Y1'Y0' for the second. An illustrative mapping of those three bits into a particular 2D signal point of an ($2^3$=8)-point constellation is shown in FIG. 19. Having eight data bits on lead 304 requires a 32-point signal constellation and the mapping into a 32-point QAM can be as shown in FIG. 20. Having 12 data bits on lead 304 requires 128-point signal constellation and the mapping can be into the 128-point QAM constellation shown in FIG. 21. Constant-amplitude, e.g., PSK constellations, rather than QAM constellations may be used in some cases. For example, the 8-point PSK constellation shown in FIG. 22 can be used instead of the 8-point QAM constellation shown in FIG. 19, in which case bit converter 316 will operate in accordance with the table shown in FIG. 23 rather than that shown in FIG. 17. A transmitter using another 4D code, but this one employing a rate-⅘ turbo code is shown in FIG. 24. Specifically, (6+2 m) bits are provided from a serial-to-parallel converter (not shown) on lead 404 for each 4D symbol interval. Four bits X5,X4,X3,X2 are applied to $M_1$-state, rate-⅘ outer trellis encoder 406 and two bits X7,X6 are applied to single-parity-check encoder 407. The latter has parameters (2·J·K, 2·J·K−1, 2). That is, the code implemented by encoder 407 has a codeword length of 2·J·K bits, of which first 2·J·K−1 bits are input bits and the last bit is a redundant parity check bit, and its Hamming distance is 2. The remaining 2 m bits are uncoded. Outer encoder 406 is illustratively the 32-state encoder shown in FIG. 25. The resulting (7+2 m) bits are applied to symbol interleaver 408 which is also generally similar to symbol interleaver 108. For each group of (7+2 m) bits output by interleaver 408, four bits are applied to $M_2$-state, rate-⅘ inner trellis encoder 410 as shown. Inner encoder 410 is illustratively the 32-state encoder shown in FIG. 26. Similar to what is shown in FIG. 14, 4D constellation mapper 411 includes bit converter 416, which is illustratively identical to bit converter 316 previously described, and further includes 2D constellation mapper 412. The two bits X6 and X7 at the output of interleaver 408 are renamed as Y3 and Y3' while the remaining 2 m uncoded bits X8, X9, etc are renamed as Y4, Y4', Y5, Y5' etc. The constellations and mappings shown in FIGS. 19–22 in conjunction with FIG. 14 can be used here as well, depending on the desired number of data bits to be transmitted for each 4D symbol interval.

A transmitter using yet another 4D code, but this one employing a rate-⅔ turbo code is shown in FIG. 27. The inner and outer trellis codes of the turbo code are illustratively the same as used in the two-dimensional arrangement shown in FIG. 1. This is a three-level code wherein two bits X5,X4 are applied to an extended-single-error-correcting encoder 550 and two bits X6 and X7 are applied to a single-parity-check encoder 545. Encoder 550, in particular, has parameters (2·J·K, 2·J·K−R, 4). In particularly, it has a codeword length of 2·J·K bits, of which the first 2·J·K−R bits are input data bits and the last R bits are redundant bits, and its Hamming distance is 4. The number R of redundant bits is chosen to be the smallest integer such that $2·J·K \leq 2^{R-1}$. Encoder 545 is illustratively identical to encoder 407 previously described.

Figure 22:
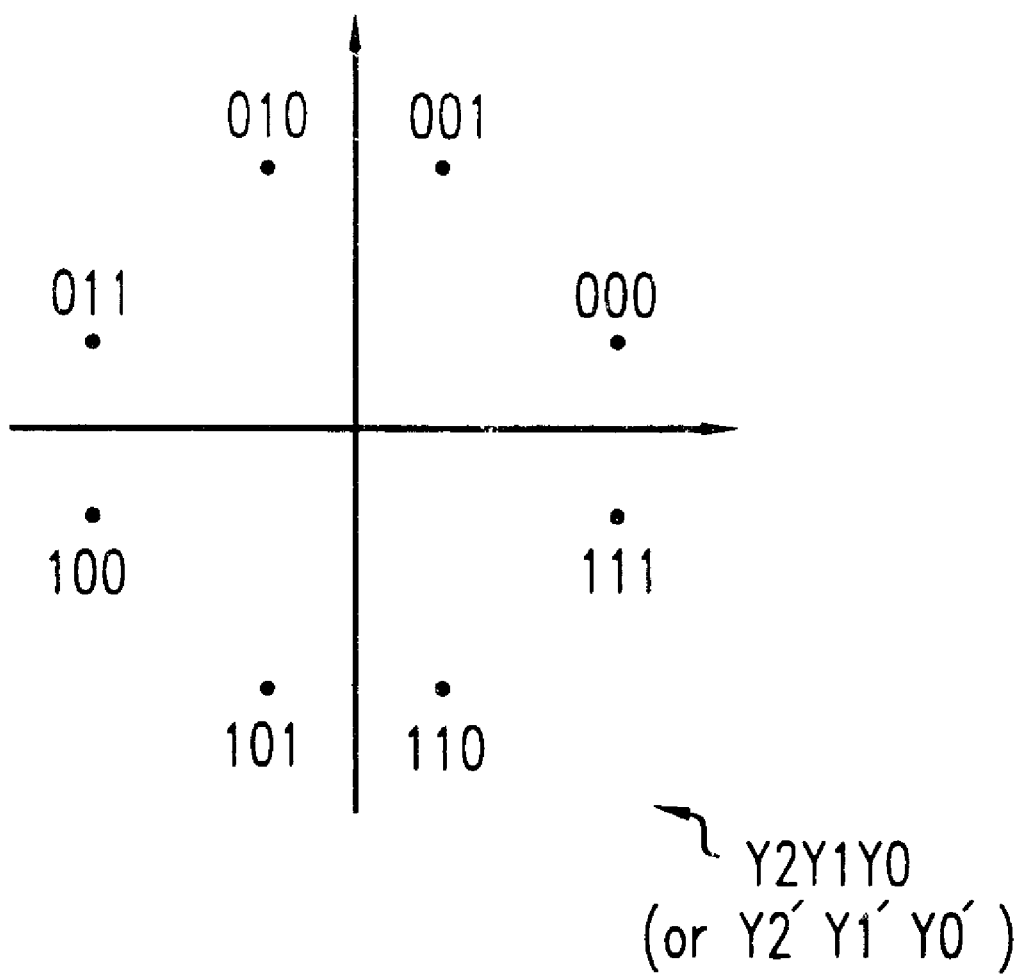
Figures 29, 30:
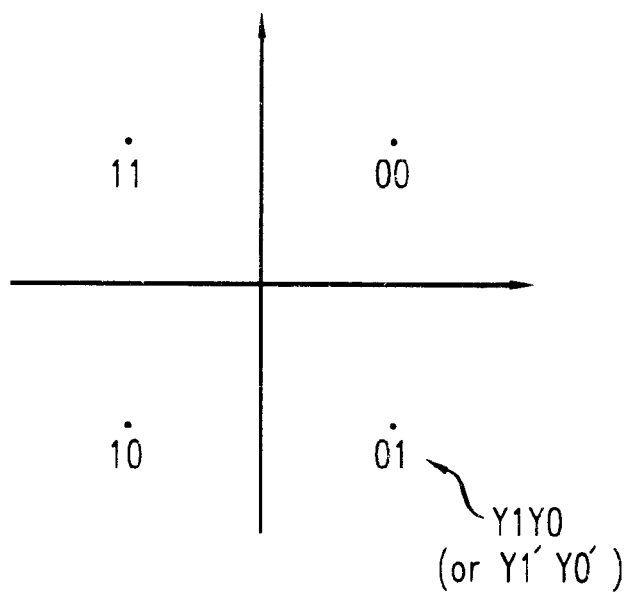
FIG. 29 is a constellation that can be used by the turbo encoder of FIG. 27.
FIG. 30 represents the operation of the bit converter illustratively used in the turbo encoder of FIG. 27 when the constellation is that of FIG. 22.

Bits X3,X2,X1,X0 are applied to a 4×4 bit converter 517 within 4D constellation mapper 511, which also includes 2D constellation mapper 512. Bit converter 517 operates on the basis of the table shown in FIG. 28. If lead 504 carries provides only the two input bits X3,X2 for each 4D symbol interval, a 16-symbol 4D constellation comprising a concatenation of two 4-point signal constellations, such as the constellation shown in FIG. 29, would be used. Although it is true in such a case that 4 bits are mapped into 4 coordinates of a 4D symbol, it is not the case that each bit determines the value of a different respective coordinate of the symbol. Rather, the mapping criterion noted above in conjunction with FIG. 6 also applies here. Namely, that at least one coordinate value is a function of more than one turbo coder output bit or, stated alternatively, the values of the symbol coordinates are determined by the turbo coder output bits interdependently. If more than two data bits are to be transmitted—such as 4, 8 or 12 data bits, the constellations and mappings such shown in FIGS. 19–22 can, again, be used. In particular, if the 8-PSK constellation of FIG. 22 is used, then 4×4 bit converter 517 would operate based on the table shown in FIG. 30.

A transmitter using the same turbo code as in FIG. 27 is shown in FIG. 31. This transmitter employs a single upper level coder which is illustratively identical to encoder 545. 4D constellation mapper 612 includes 4×4 bit converter 617 and 2D constellation mapper 612. Converter 617 illustratively operates based on the table shown in FIG. 30 and the constellation is illustratively the 16-point PSK constellation shown in FIG. 7.

The decoder architecture shown in FIG. 10 is discussed above in the context of the rate-⅔ turbo coding arrangement of FIG. 1. However, this same basic architecture can be used for the rate-⅗ and ⅚ turbo codes. In such a case, however, the second-level decoder 224 needs to be an decoder appropriate for the second-level codes used in those embodiments—for example, a four-state Viterbi decoder would be used to decode the double-parity-check code used as the second-level code of FIG. 14 and a $2^R$-state Viterbi decoder would be used to decode the extended-single-error-correcting code used as the second-level code of FIG. 27. In addition, if a three-level code is used, such as in the embodiment of FIG. 27, the overall decoder structure needs to include a decoder appropriate for the third-level code. In the case of FIG. 27, a two-state Viterbi decoder (not shown) would thus be included within the decoder of FIG. 10. In particular, then, final hard decisions as to the values of bits X5 and X4 generated by second-level decoder 224 would be used as final decoder outputs. At the same time, the final hard decisions as to bits X5,X4,X3,X2, X1 and X0 would be supplied to the third level decoder, along with the output from deinterleaver 223, thereby allowing the third-level decoder to generate final hard decisions as to all the remaining coded and uncoded bits.

Comparison of the Various Codes

Various considerations come into play in determining which particular one of the above-described or other turbo coding arrangements might be used in any particular application. For example, the two-dimensional embodiment of FIG. 1 requires a constellation that is twice as large as required by the other, four-dimensional embodiments. The performance of certain components in the receiver, e.g., carrier recovery, may be worse in the former case than in the latter under certain circumstances, e.g., a fast time-varying channel. The embodiments of FIGS. 1, 14 and 27 all offer approximately the same level of error rate performance—at least for additive white Gaussian noise (AWGN) channels—comparable implementational complexity, and comparable interleaver length, and thus comparable latency, i.e., overall delay in the communication of the data, with the embodiment of FIG. 1 having the potential to provide the lowest latency of all. Advantageously, the implementational complexity of the embodiment of FIG. 14 is relatively independent of the interleaving length, whereas the implementational complexity of the embodiment of FIG. 27 approximately doubles when the interleaving length goes beyond 256 two-dimensional signal points. Under poor channel conditions, error rate performance is better when the constellation size is smaller. In this regard, an advantage of the FIG. 14 embodiment is that it can be used with a 4-singal-point constellation whereas, this is not possible for the FIG. 27 embodiment, for example. The best error rate performance of all the embodiments disclosed herein is offered by the embodiment of FIG. 24. However, that embodiment has the highest implementational complexity and latency of all the embodiments.

The embodiments of FIGS. 1, 14, 24 and 27 can all be used with, for example, QAM constellations of various different sizes as well as with, for example, constant amplitude, e.g., PSK, constellations for bandwidth efficiency up to 2 bits per signal point. However, in applications in which the use of a constant-amplitude constellation is preferred (e.g., certain wireless transmission applications) and at the same time a bandwidth efficiency greater than 2 bits per signal point is desired, the embodiment of FIG. 31 should be considered in that it offers better performance, lower implementational complexity and shorter interleaving length than the other embodiments.

Turbo Code Termination

In certain applications it may be desirable to periodically terminate the turbo code. This means that after random input data has been applied to the turbo encoder for some number of symbol intervals, data other than random input bits is thereupon applied to the turbo encoder over a sufficient number of symbol intervals so as to bring each of the encoders to a known state. Random data bits are then again applied to the turbo encoder and the code is thereafter again terminated, and so forth. Terminating a turbo code is desirable because the decoder—which has explicit knowledge of how the code is terminated in the transmitter—can be less complex (measured in processing time and/or memory requirements) than otherwise. Furthermore, it is advantageous to terminate a turbo code (as well as more conventional convolutional and trellis codes) in, for example, packet transmission environments, for reasons discussed, for example, in my U.S. patent application Ser. No. 09/247704 filed Feb. 9, 1999. Termination of codes may also be advantageous in so-called continuous transmission environments, e.g., voiceband modem applications, as a way of containing the effects of error propagation.

A number of considerations go into the design of the steps to be carried out in terminating the turbo code. Indeed, it is those considerations that resulted in the specifics of the termination process used in the present illustrative embodiment. The manner in which the termination is carried out will first be explained, followed by a discussion of the considerations that led thereto.

Reference is first made back to FIG. 5. It will be recalled that the 0,1,2 . . . 195 numbers shown in the FIG. 5 matrix elements represent the $0^{th}$, $1^{st}$, $2^{nd}$, etc. group of output bits of encoder 106 in each interleaving frame comprising 196 such bit groups. More particularly, then, the last three bit groups generated by outer encoder 106 are those having the sequence numbers "193", "194" and "195". Since the bit groups are read out of the interleaver on a column-by-column basis from left to right, the last two bit groups output by the interleaver and applied to inner encoder 110 are those having the sequence numbers "167" and "195". The four sequence numbers "167" "193", "194" and "195" are circled in the FIG. to help the reader follow the discussion that follows.

Assuming that encoders 106 and 110 are implemented as the 8-state encoders shown in FIGS. 2 and 4, respectively, each of them requires two symbol intervals for termination. In particular, the inner code is terminated by using internally stored bits W1,W2 in place of data bits X2,X1, respectively, as the encoder input bits during encoder 110's last two symbol intervals "167" and "195". This will bring encoder 110 to state "0" (i.e., all three internal stored bits are "0") at the end of symbol interval "195."

The outer code is terminated not during its own last two symbol intervals, but rather its second- and third-to-last symbol intervals "193" and "194." In particular, during symbol interval "193" one of encoder 106's input bits is data bit X3, while internally stored bit W2 is used in place of data bit X2. Then, during symbol interval "194," data bits X3,X2 are replaced by internally stored bits W1 and W2, respectively, as was the case for encoder 110. This will bring encoder 106 to state "0" (i.e., all three internal stored bits are "0") at the end of symbol interval "194."

As a further aspect of the termination process, outer encoder 106 is not operated for symbol intervals "167" and "195". That is, no input bits are taken into encoder 106 itself during those intervals and the state of outer encoder 106 is not advanced. (Upper level input bits X4, X5, . . . may be taken in and processed in the usual way during those intervals.)

In further consideration of the termination of the turbo code, it may be observed that the fact that no values for bits X2,X1 are generated for symbol intervals "177" and "195 " is not of consequence vis-a-vis inner encoder 110 because, as noted above, encoder 110 gets its inputs from its own internal bits during those intervals. However, constellation mapper 112 still needs a value for bit Y3 during those intervals. Normally bit Y3 is the same as bit X3 and indeed that could be case during these symbol intervals. However, the value of bit X3 is not protected by the outer code during these intervals because the outer code is not then being operated. The performance of the overall turbo code could then be greatly effected negatively by this. Another approach would be to send a "dummy" bit of known value so that that bit will never need to be coded. However, in preferred embodiments, the values of bits X2,X1,X0 are shifted up to become bits X3,X2,X1, respectively, during symbol intervals "167" and "195," with X0 being set to a predefined, non-information-bearing value, before those bits are applied to constellation mapper.

The considerations that led to the above-described termination process will now be discussed.

First off, one might think that the outer code should have been terminated during its final two symbol intervals "194" and "195" in order to maximize the amount of data that can be transmitted during an interleaving frame. However, if any bits were generated by outer encoder 106 during symbol interval "195," those bits would not ever be transmitted because, as seen above, they are ignored by inner encoder 110 as part of its own termination process. By using symbol intervals "193" and "194" to terminate the outer code, and not operating it during symbol interval "195" as previously stated, this problem is avoided. Moreover, it is because inner encoder 110 also ignores the output bits of outer encoder during symbol interval "167" that outer encoder 106 is not operated during symbol interval "167" either. This example is illustrative of a general design approach in which the state of the outer code is not advanced for symbol intervals during which the inner code is being terminated.

Another consideration arises from the fact that the input bits for the inner code are not taken from the output of the outer code during the inner code's termination symbol intervals "193" and "194". This can negatively affect the overall performance of the code. Advantageously, this situation can be ameliorated by using a smaller symbol constellation, with greater minimum distance between the symbols, during the termination symbol intervals. Indeed, it will be appreciated by those skilled in the art upon a consideration of FIGS. 6-9 that this is the practical result of the approach described above of shifting up the values of bits X2, X1, X0 to become bits X3,X2,X1, respectively, while setting X0 to a fixed value because it results in an enhancement of the so-called branch metrics generated in the decoder associated with the symbols generated during those intervals. (Such a smaller constellation may comprise particular symbols of the constellation used for the other symbol intervals, but need not be.) Other ways of protecting against compromised code performance during the termination symbol intervals involve designing the inner code in such a way that a) no error event happens completely within the termination symbol intervals, and b) the intersubset distance between the subsets assigned to the trellis in the final termination symbol interval is made as large as possible. Indeed, the inner codes used in the present illustrative embodiments meet these criteria.

The process of terminating a rate-$\frac{2}{4}$ turbo code using rate-$\frac{2}{3}$ inner and outer trellis codes, as in some of the illustrative embodiments hereof, may be described in formal terms as follows:

Express the sequence numbers of the J·K symbol intervals of an interleaving frame on both the input and output side of the symbol interleaver as 0, 1, . . . , and J·K−1.

To facilitate the termination of the inner code, the outer code operates in only J·K−2 symbol intervals. It does not operate in the J·K−1−(J·K/J$_1$)$^{th}$ (or J·K−1−K$^{th}$ if J$_1$=1) and the last J·K−1$^{th}$ symbol intervals on the input side of the interleaver.

The termination of the outer code is otherwise done in the usual way. For the 8-state code, the input bit X2 is set at W2 of the encoder state machine in the J·K-3th symbol interval on the input side of the interleaver; and the input bits X3 and X2 are set at W1 and W2, respectively, in the J·K$_{-2}$$^{th}$ symbol interval. For the 16-state code, the input bits X3 and X2 are set at W2⊕W3 and W 1 W2⊕W3, respectively, in both the J·K−3$^{th}$ and J·K−2$^{th}$ symbol intervals, where ⊕ is the exclusive OR operation on the bits.

The inner code is, on the other hand, operational in all the J·K symbol intervals. Its termination is done in the last two symbol intervals on the output side of the interleaver, which correspond to the two symbol intervals on the input side of the interleaver when the outer code is not operational.

Depending on the inner code, its termination may not be done in the usual way. For example, for the 8-state code, the input bits X2 and X1 are set at W1 and W2, respectively, of the encoder state machine in both the J·K−2$^{th}$ and J·K−1$^{th}$ symbol intervals (while in the usual way, the input bit X2 in the J·K−2$^{th}$ symbol interval is a data bit).

Moreover, the process of terminating rate-$\frac{3}{5}$ and $\frac{4}{6}$ turbo codes using rate-$\frac{2}{3}$ and rate-$\frac{4}{5}$ inner and outer trellis codes, respectively, as in others of the embodiments hereof, may be described in formal terms as follows:

The termination of the outer code is done in the usual way. For the 16-state rate-$\frac{3}{4}$ code, the input bit X2 is set at W3 of the encoder state machine in the J·K−3$^{th}$ symbol interval on the input side of the interleaver; and the input bits X4, X3, and X2 are set at W2, W1, and W3, respectively, in the J·K−2$^{th}$ symbol interval. For the 32-state rate-$\frac{4}{5}$ code, the input bit X2 is set at W4 in the J·K−3$^{th}$ symbol interval; and the input bits X5, X4, X3, and X2 are set at W2, W1, W3, and W4, respectively, in the J·K−2$^{th}$ symbol interval.

On the other hand, the termination of both the inner 16-state rate-$\frac{3}{4}$ and 32-state rate-$\frac{4}{5}$ codes is not done in the usual way. For the rate-$\frac{3}{4}$ code, the input bits X3, X2, and X1 are set at W1, W2, and W3, respectively, of the encoder state machine in both the J·K–$2^{th}$ and J·K–$1^{th}$ symbol intervals and for the rate-⅘ code, the input bits X4, X3, X2, and X1 are set at W1, W2, W3, and W4, respectively, in both the J·K–$2^{th}$ and J·K–$1^{th}$ symbol intervals.

Similar to the rate-⅔ inner code, the values of output bits X3, X2, X1, X0 of the inner rate-¾ code are shifted up to become bits X4, X3, X2, X1, respectively, with X0 being set to a predefined non-information-bearing value, before those bits are applied to the constellation mapper in the last two terminating symbol intervals. Likewise, the values of output bits X4, X3, X2, X1, X0 of the inner rate-⅘ code are shifted up to become bits X5, X4, X3, X2, X1, respectively, with X0 being set to a predefined non-information-bearing value in the last two terminating symbol intervals.

Turbo Code Design

To aid in an appreciation of how advantageous turbo codes embodying the principles of the invention can be designed, the considerations that went into the design of the various turbo codes disclosed herein will now be discussed. In particular, consider first the design of a multilevel code using a first-level serial-concatenated 2D turbo code with a bandwidth efficiency of 4 bits per 2D signal point (this is the embodiment of FIG. 1 with m=1).

First, we consider how to design the first-level turbo code.
Step 1: Determine the constellation size.
  Since each of the inner and outer codes of the turbo code generates one redundant bit, a 64-symbol signal constellation is needed, which is shown in FIG. 8.
Step 2: Determine how fine the constellation should be partitioned for the turbo code and how many bits are input to (the outer code of) the turbo code.
  In order for the turbo code to achieve a coding gain of at least 6 dB, the constellation should be partitioned into 16 "turbo code" subsets with the intra-subset minimum distance being maximized. In FIG. 8, each such subset is identified by a bit pattern of Y3Y2Y1Y0. The number of subsets then determines how many bits are input to (the outer code of) the turbo code. In this case, the number of input bits is two, which is obtained by subtracting the two redundant bits from the four bits that are needed to identify a "turbo code" subset.
Step 3: Design the inner code.
(a) Select the rate.
  The inner code can have three possible different rates in this case: ½, ⅔, and ¾. We have chosen to use rate-⅔ in FIG. 1 because it offers the best combination of performance, complexity, and interleaving length.
(b) Select the number of states.
  For rate-⅔, the inner code can set the number of states at 4, 8, 16, and so on. We have chosen to use 8 states in FIG. 1, again because it offers the best combination of performance, complexity, and interleaving length.
(c) Once the rate and number of states are selected for the inner code, the remaining design of the inner code is just like a single-stage trellis code. Specifically, the inner code is designed by partitioning the entire 64-symbol constellation into only eight "inner code" subsets with its intra-subset minimum distance being maximized. Each such subset is identified by a bit pattern Y2Y1Y0 in FIG. 8. These subsets are assigned to the state transitions of the inner code such that the minimum distance between valid sequences of subsets of the inner code is maximized. To achieve that goal, the inter-subset minimum distance between the subsets assigned to the state transitions that originate from a given current state or merge into a given next state of the inner code should be maximized.

Note that the design of the inner code poses some constraint on how the bit patterns of Y2Y1Y0 should be assigned to the eight "inner code" subsets of the 64-symbol constellation. Specifically, let the 64-symbol constellation be partitioned into two 32-symbol subconstellations with its intra-subconstellation minimum distance being maximized. Each such subconstellation is identified by a bit value of Y0 in FIG. 8 and can be shown to comprise four "inner code" subsets of the 69-symbol constellation.

The four bit patterns 000, 010, 100, 110 of Y2Y1Y0 should then be assigned to the four subsets of one subconstellation, and the four remaining bit patterns 001, 011, 101, 111 of Y2Y1Y0 should be assigned to the four subsets of the other subconstellation. However, as far as the inner code is concerned, the assignments of the first four bit patterns 000, 010, 100, 110 to the subsets are independent of the assignments of the remaining four bitpatterns 001, 011, 101, 111.

Step 4: Design the outer code.
(a) Select the rate.
  The outer code can have only rate-⅔ in this case.
(b) Select the number of states.
  For rate-⅔, the outer code can set the number of states at 4, 8, 16, and so on. We have chosen to use 8 or 16 states in FIG. 1, because they offer the best combinations of performance, complexity, and interleaving length.
(c) Once the rate and number of states are selected for the outer code, the remaining design of the outer code is as follows. It is designed as if the inner code were absent, that is, as if the redundant bit Y0 generated by the inner code had a fixed value of 0 or 1. In this case, the constellation has only 32 symbols and is either one of the two 32-symbol subconstellations identified by a bit value of Y0 in FIG. 8, as mentioned in Step 3. Each subconstellation can be shown to comprise eight "turbo code" subsets, each subset being identified by a bit pattern of Y3Y2Y1 along with the value of Y0 for the subconstellation in FIG. 8, as mentioned in Step 2. These subsets are assigned to the state transitions of the outer code such that for each subconstellation, the minimum distance between valid sequences of subsets of the outer code is maximized. To achieve that goal for each subconstellation, the inter-subset minimum distance between the subsets assigned to the state transitions that originate from a given current state or merge into a given next state of the outer code should be maximized.

Note that, just like a single-stage trellis code, the design of the outer code poses some constrains on how the bit patterns of Y3Y2Y1 should be assigned to the eight "turbo code" subsets of each 32-symbol subconstellation. However, the assignments of the bit patterns of Y3Y2Y1 to the eight "turbo code" subsets of one subconstellation are so far still independent of the assignments of the bit patterns of Y3Y2Y1 to the eight "turbo code" subsets of the other subconstellation.

Step 5: Design the constellation mapper.
  The outer code of Step 4 is designed in the absence of the inner code. In the presence of the inner code, however, each "turbo code" subset identified by the outer code for one subconstellation may be transmitted as a different "turbo code" subset for the other subconstellation. In this case, the two "turbo code" subsets would have the same bit pattern for Y3Y2Y1 but different bit values for Y0. To preserve the coding gain of the outer code in the presence of the inner code, the assignments of the bit patterns of Y3Y2Y1Y0 to the 16 "turbo code" subsets are done such that the inter-subset minimum distance for each pair of "turbo code" subsets with the same bit pattern for Y3Y2Y1 and different bit values for Y0 is minimized. In FIG. 8, the inter-subset minimum distance for each such pair of "turbo code" subsets is equal to the minimum distance (between any two symbols) of the 64-symbol constellation, and is thus indeed minimized.

Note that in this last step of the turbo code design, the assignments of the bit patterns of Y3Y2Y1 to the eight "turbo code" subsets of one subconstellation are no longer independent of the assignments of the bit patterns of Y3Y2Y1 to the eight "turbo code" subsets of the other subconstellation.

To summarize, in the design of the first-level turbo code, we have used: (a) a specific rule to map the output bits of the inner code to various subsets of the overall constellation; (b) another specific rule to map the output bits of the outer code to various subsets of each subconstellation identified by the redundant bit of the inner code; and (c) yet another specific rule to map jointly the output bits of the outer code and the redundant bit of the inner code to various subsets of the overall constellation. The design of the inner code, outer code, and constellation mapper are thus done in a joint manner, especially in view of rule (c). In a general sense, a so-called "joint design" has been at least minimally achieved when distance between valid sequences of symbols is greater than product of the minimum generalized Hamming distance times the minimum distance of the constellation (i.e., the minimum distance between symbols of the constellation.) The generalized Harming distance between any two sequences is the number of positions in which two sequences of symbols are different. In a non-joint-design code, the aforementioned actual Euclidean distance might be the same as the aforementioned product.

Next, we consider how to design the second-level code of the multi-level code. It turns out that the performance of the turbo code described above is dominated by its intra-subset minimum distance, i.e., the minimum distance between the symbols of each "turbo code" subset. To further improve that performance, an easy and well-known way is to employ a simple second-level single-parity-check (SPC) code, as shown in FIG. 1. The code is designed based on a further partition of each "turbo code" subset into two "second level code" subsets with the intra-subset minimum distance being maximized. In FIG. 8, each such "second level code" subset is identified by a bit value for Y4, along with the bit pattern of Y3Y2Y1Y0 for the corresponding "turbo code" subset.

The same procedure used to design the multi-level code of FIG. 1 can also be used to design the multi-level code of FIG. 14. The characteristics of the multi-level code of FIG. 14 are highlighted as follows:

1) The constellation is 4D.
2) In order for the first-level turbo code to achieve a coding gain of at least 6 dB, the 4D constellation is partitioned into 32 "turbo code" 4D subsets with the intra-subset minimum distance being maximized. Each such 4D subset is identified by a bit pattern of X4X3X2X1X0 in FIG. 17. The number of bits input to (the outer code of) the turbo code in each 4D symbol interval is 3.
3) The inner code is 16-state rate-¾ because it offers the best combination of performance, complexity, and interleaving delay. The inner code is designed by partitioning the entire 4D constellation into only 16 "inner code" 4D subsets with the intra-subset minimum distance being maximized. Each such 4D subset is identified by a bit pattern of X3X2X1X0 in FIG. 17. These 4D subsets are assigned to the state transitions of the inner code such that the minimum distance between valid sequences of subsets of the inner code is maximized. To achieve that goal, the inter-subset minimum distance between the subsets assigned to the state transitions that originate from a given current state or merge into a given next state of the inner code should be maximized.
4) The outer code is also 16-state rate-¾, again because it offers the best combination of performance, complexity, and interleaving delay. The outer code is designed as if the inner code were absent, that is, as if the redundant bit X0 generated by the inner code had a fixed value of 0 or 1. In this case, the 4D constellation is either of the two 4D subconstellations identified by a bit value of X0 in FIG. 17. Each 4D subconstellation comprises 16 "turbo code" 4D subsets. These 4D subsets are assigned to the state transitions of the outer code such that for each subconstellation, the minimum distance between valid sequences of subsets of the outer code is maximized. To achieve that goal, the inter-subset minimum distance between the subsets assigned to the state transitions that originate from a given current state or merge into a given next state of the outer code should be maximized.
5) To preserve the coding gain of the outer code in the presence of the inner code, the assignments of the bit patterns of X4X3X2X1X0 to the 32 "turbo code" 4D subsets are done such that the inter-subset minimum distance for each pair of "turbo code" 4D subsets with the same bit pattern for X4X3X2X1 and different bit values for X0 is minimized.
6) The performance of the turbo code is dominated by the intra-subset minimum distance of the "turbo code" 4D subset. To further improve that performance, a simple second-level double-parity-check (DPC) code is used. The second-level code is designed based on a further partition of each "turbo code" 4D subset into four "second level code" 4D subsets with the intra-subset minimum distance being maximized. Each such "second level code" 4D subset is identified by a bit value for X5 and a bit pattern of X4X3X2X1X0 for the corresponding "turbo code" 4D subset in FIGS. 17, along with a bit value for X6 in FIG. 18.

Unlike the turbo code of FIG. 1, the turbo code of FIG. 14 has another important characteristic. Each of the inner and outer codes of the turbo code of FIG. 14 is a "bad" trellis code by itself. By "bad" we mean that when the inner or outer code is not concatenated with another code, the inner or outer code requires a complexity much higher than needed in order to achieve its performance. The performance of the 4D 16-state rate-¾ inner or outer code in FIG. 14, when used by itself, is about the same as that of a 4D 8- or 16-state rate-⅔ trellis code. However, the complexity of the 4D 16-state rate-¾ code is about four or two times that of the 4D 8- or 16-state rate-⅔ code.

What is unusual about the "bad" 4D 16-state rate-¾ code is that it has an intra-subset minimum distance much larger than the good 4D 8- or 16-state rate-⅔ code. Although this larger intra-subset minimum distance does not help the 4D 16-state rate-¾ code to outperform the 4D 8- or 16-state rate-⅔ code when the code is used by itself, it does help when the code is used in a concatenated manner to form a turbo code. Had the 4D 8- or 16-state rate-⅔ code been used to form the turbo code, the performance of the turbo code would also be dominated by its intra-subset minimum distance, which would provide a coding gain of only 3 dB! Using a more powerful turbo code as the first-level code of a multi-level code can help to greatly simplify the upperlevel codes and improve the performance of the overall multilevel code, as we shall further discuss below.

The multi-level code of FIG. 24 is designed in a way almost identical to that of FIG. 14, except that the first-level turbo code of FIG. 24 is designed based on a finer partition of the 4D constellation into 64 "turbo code" 4D subsets. Each such 4D subset is identified by a bit pattern of X5X4X3X2X1X0 in FIG. 17. Using such a finer partition further improves the performance of the first-level turbo code and its associated multi-level code.

Just like the turbo code of FIG. 14, each of the inner and outer codes of the turbo code of FIG. 24 is a "bad" trellis code by itself. In fact, the 4D 32-state rate-⅘ inner or outer code of FIG. 24 is even worse than the 4D 16-state rate-¾ code of FIG. 14 when the code is used by itself. Also just like the turbo code of FIG. 14, a better performance results when these "bad" trellis codes are concatenated to form a turbo code. What is unusual about the "bad" 4D 32-state rate-⅘ code is again its relatively large intra-subset minimum distance, which is needed by the turbo code in order to deliver a superb performance.

In the embodiment of FIG. 27, the first-level 4D rate-⅔ turbo code is designed using the same procedure as that used in the earlier embodiments. However, a different philosophy is used to construct the corresponding multi-level code. In the earlier embodiments, the first-level turbo code is very powerful by itself, and requires only a simple second-level code for assistance. In the current embodiment, the first-level turbo code is not powerful enough, and requires a big help from the upper-level codes to boost its performance.

Specifically, the turbo code of FIG. 27 is constructed based on a partition of the 4D constellation into only 16 "turbo code" 4D subsets. Each such subset is identified by a bit pattern of X3X2X1X0 in FIG. 28. As a result, the turbo code can only offer a coding gain of 3 dB. However, if we do not count the error events that occur within the correctly-decoded sequence of "turbo code" subsets, then the coding gain of the turbo code can be shown to exceed 6 dB.

To further correct the error events within the correctly-decoded sequence of "turbo code" subsets, a rather powerful and complex second-level extended single-error-correcting (ESEC) code, followed by a simple third-level SPC code, is used as shown in FIG. 27. Together, the three codes achieve a coding gain of at least 6 dB.

In the discussion of the code design, we have so far implicitly assumed that the 2D constellation either has multiple amplitudes or is a constant-amplitude 4-PSK. The embodiment of FIG. 1 remains unchanged when the 2D constellation is a constant-amplitude 16-PSK. The embodiments of FIGS. 14, 24, and 27 are changed slightly when the constituent 2D constellation of the 4D constellation is a constant-amplitude 8-PSK. This change is caused by the different distance properties of the 8-PSK, and affects only the constellation mapping tables shown in FIGS. 17 and 28. The mapping tables of FIGS. 23 and 30 should be used instead. Note, however, that everything else remains unchanged, including the procedure used to design the turbo codes.

When the constituent 2D constellation of the 4D constellation is a constant-amplitude 16-PSK instead of a multiple-amplitude 16-QAM, a simpler multi-level code can be constructed as shown in the embodiment of FIG. 31. This simplification is again caused by the different distance properties of the 16-PSK. Specifically, in FIG. 31, the first-level 4D rate-¾ turbo code is designed based on a partition of the 4D constellation into 16 "turbo code" 4D subsets, using the same procedure as described earlier for the other embodiments. Each such 4D subset is identified by a bit pattern of X3X2X1X0 in FIG. 30. Unlike the 4D rate-¾ turbo code of FIG. 27, however, the turbo code here is powerful enough, and requires only a simple second-level SPC code for assistance.

Other Variations

The foregoing merely illustrates the principles of the invention and many variations are possible. A number of examples of this now follow:

Although in preferred embodiments the inner and outer encoders are trellis encoders, the use of other types of redundancy encoders may be possible. Although many types of codes may be represented by a trellis and thus may in some sense be called trellis codes, the term trellis code as used herein means a code which is a finite state machine. For each of a majority of symbol intervals, the code can be defined by the relationships between the current state, the next state, the current input bits, the current output bits, and the coordinates of the symbol of the constellation to be identified by the current output bits. These relationships are characterized by: (a) the number of current output bits is more than that of the current input bits; (b) the current output bits are functions of some of the current and previous input bits, but not functions of any future input bits; and (c) the coordinates of the symbol are identified by the current output bits in a joint manner, that is, at least one coordinate of the symbol is a function of at least two current output bits.

Adequate performance may be achieved in certain applications if none of the upper level bits—that is, none of the bits not applied to the outer trellis encoder—is encoded. In such case, the upper level bits would be used directly to select a symbol from the subset identified by the turbo encoder output bits.

The parameter m representing, for example, the number of uncoded bits on lead 1046 of FIG. 1 and on corresponding leads in other FIGS. may take on a fractional value, which can be accommodated using, for example, the technique described in my U.S. Pat. No. 4,941,154 issued Jul. 10, 1990.

The invention can be used in conjunction with so-called shaping techniques known in the art to achieve "shaping" gain through the use of an expanded signal constellation in conjunction with a mapping that favors lower energy signal points.

It is not necessary for the non-turbo-encoded bits to be interleaved along with the turbo-coded bits. Rather, the non-turbo-encoded bits may bypass the interleaver, if desired, without negatively affecting performance.

Although each of the turbo codes disclosed herein comprises the concatenation of two encoders, even better performance might be achieved via a concatenation of three or more encoders combined with appropriately designed interleavers.

In all of the embodiments explicitly shown herein, the processing proceeds from outer encoding, through interleaving to inner encoding to mapping. It may be possible, however, for the flow to be in a different order while still achieving an equivalent result on an input-bits-to-selected-symbol basis. The standard known as V.34, for example, includes so-called precoding and allows for a processing flow in which encoding-in that case conventional trellis encoding-is carried out after a mapping has been performed, and it may be possible for a processing flow with that general flavor to be used in conjunction with turbo codes embodying the principles of the present invention as well. The processing in such an arrangement might proceed, for example, in the following order: outer encoding, interleaving, precoding/mapping, and inner encoding.

In contrast to the embodiments disclosed herein, it is possible for the inner encoder to have as its inputs all of the outer encoder output bits. Thus, for example, it is possible for inner encoder 110 to be a rate-¾ encoder which has as its inputs not only bits X2, X1 but also bit X3. A rate-¾ code is significantly more complex than a rate-⅔ code, however, and the amount of additional coding gain achieved for the overall turbo code by using a rate-¾ code here is likely to be very small or non-existent. Moreover, unless a longer interleaver were to be used in conjunction with such an increased-complexity code, there might be an actual coding gain loss. Disadvantageously, moreover, use of a longer interleaver increases latency.

The parameters $M_1$ and $M_2$—the number of states of the outer and inner encoders, respectively—can be any values that prove to be advantageous in a particular environment. It does appear, however, that if additional complexity can be tolerated by increasing the number of states in one or the other of the encoders, the performance improvement resulting from the increased complexity will be greater by increasing $M_1$ rather than increasing $M_2$.

Interleavers and trellis encoders other than those described herein may be used.

In each of the embodiments disclosed herein, the inner and outer encoders have the same rate, i.e. both are rate-⅔ or rate-¾ or rate-⅘. However, the inner and outer encoders may have rates which are different from one another as well as being different from the three rates used in the disclosed embodiments.

Turbo codes embodying the principles of the invention may be terminated by techniques other than those disclosed herein, including the use of a smaller constellation which, contrary to what is disclosed herein, has the same distance between symbols. (Such an approach would seem to provide no advantage and, indeed, may result in lowered error rate performance for the symbols during the terminated symbol intervals.). Moreover, the present turbo codes can be used without employing any termination technique at all.

Although all of the trellis codes disclosed herein are systematic codes (i.e., all the input bits appear as output bits along with at least one redundant bit which is a function of various current and the code state variables), it is possible for them to be non-systematic, although it appears that using a non-systematic code for the inner code will significantly negatively affect the overall turbo code performance.

It may be desirable for at least some of the bits on leads 104, 304, etc. to have been processed by a Reed-Solomon or other code so as to protect such bits from the effects of impulse noise or other impairments. Indeed, a Reed-Solomon or other code could be used in place of the parity-check or error-correcting codes shown as the upper level codes in the various disclosed multi-level code embodiments.

In the illustrative embodiments, both encoders have the same dimensionality. That is, each one generates one redundant bit (i.e., makes a state transition) for each symbol interval. It may be possible, however, to design worthwhile codes in which this is not the case—for example, the outer code may be a four-dimensional code, meaning that it generates one redundant bit for each four-dimensional symbol while the inner code is a two-dimensional code, meaning that it generates one redundant bit for each of the two constituent two-dimensional signal intervals of the four-dimensional symbol interval.

If desired, the data symbols generated by the constellation mapper may be further processed prior to pulse-shaping and modulation. One such processing might be, for example, Tomlinson precoding such as disclosed in my U.S. Pat. No. 5,195,107 issued Mar. 3, 1993.

It is possible for more than one outer encoder output bit to be not further encoded by the inner code, even though only one outer encoder output bit (e.g., bit X3 in FIG. 1) is not further encoded by the inner code in each of the embodiments explicitly shown herein.

It may prove to be desirable to subject a turbo code embodying the principles of the invention to so-called "puncturing" meaning that not all of the encoder output bits are always transmitted. This approach would allow for the use of a smaller signaling constellation during the punctured signaling intervals, which may be advantageous from the standpoint of, for example, timing recovery and/or carrier phase recovery. Alternatively the same size constellation can be used, allowing for the transmission of some kind of auxiliary information, if desired.

It will be appreciated by those skilled in the art that the block diagrams herein represent conceptual views of illustrative circuitry embodying the principles of the invention. The functions of the various elements shown in the FIGS. would, in preferred embodiments, be implemented by one or more programmed processors, digital signal processing (DSP) chips, or the like rather than individual hardware elements.

In the claims hereof any element expressed as a means for performing a specified function is intended to encompass any way of performing that function including, for example, a) a combination of circuit elements which performs that function or b) software in any form (including, therefore, firmware, microcode or the like) combined with appropriate circuitry for executing that software to perform the function. The invention defined by such claims resides in the fact that the functionalities provided by the various recited means are combined and brought together in the manner which the claims call for. Applicant thus regards any means which can provide those functionalities as equivalent as those shown herein.

Although the coding schemes disclosed herein are either two- or four-dimensional; the invention can be used with constellations of any desired dimensionality, including, one-dimensional constellations, as well as constellations of dimensionality greater than four of constellations whose number of dimensions is an odd number.

It will thus be appreciated that those skilled in the art will be able to devise numerous arrangements which, although not explicitly shown or described herein, embody the principles of the invention and are within their spirit and scope.

What is claimed is:

1. A method comprising the steps of
encoding a current one of a sequence of input bit groups using a first redundancy code to generate an expanded group of first redundancy encoder output bits, each of which is a function of at least one bit from the current input bit group or at least one previous input bit group,
encoding a predetermined number of said first redundancy encoder output bits using a second redundancy code to generate an expanded group of second redundancy encoder output bits, said predetermined number of first redundancy encoder output bits including at least one bit which is a function of at least one bit from said at least one previous input bit group, selecting a data symbol from a predetermined signal constellation as a function of a plurality of bits, said plurality of bits including any remaining ones of said first redundancy encoder output bits and said second redundancy encoder output bits, said data symbol being represented by at least one signal space coordinate which is a function of more than one of said plurality of bits, interleaving on a bit-group-by-bit-group basis the expanded groups of said first redundancy encoder output bits prior to the second said encoding step, and encoding a second sequence of input bit groups using at least one predetermined upper level code, said selecting step selecting said data symbol as a further function of at least one of the encoded second sequence bits.

2. The invention of claim 1 wherein the bits of said expanded group of first redundancy encoder output bits are not a function of bits in any future input bit groups.

3. The invention of claim 1 wherein at least one of said first redundancy encoder output bits is a bit from said current input bit group.

4. The invention of claim 1 wherein said predetermined number of first redundancy encoder output bits is less than the number of bits in said expanded group of first redundancy encoder output bits.

5. The invention of claim 1 wherein each of said redundancy encoders is a finite state machine having a current state, and wherein both the output bits generated by each redundancy encoder, and a next state of said each redundancy encoder, are each a function of said current state and of the bits then being encoded.

6. The invention of claim 1 wherein in said selecting step, said data symbol is selected as a further function of at least one further bit.

7. The invention of claim 1 wherein said selected data symbol is represented by more than two signal space coordinates.

8. The invention of claim 1 wherein said signal constellation includes more than four data symbols.

9. The invention of claim 1 wherein in said selecting step, each different pattern of said plurality of bits identifies a corresponding subset of the symbols of said signal constellation, and the minimum Euclidian distance between any two of said subsets is not a function of the Hamming distance between the two corresponding bit patterns.

10. The invention of claim 1 or 9 wherein said expanded group of second redundancy encoder output bits includes all of said predetermined number of said first redundancy encoder output bits as well as a redundant bit.

11. The invention of claim 10 wherein said selecting is such that when a pair of said bit patterns differ only in the value of said redundant bit, the minimum Euclidian distance between the two corresponding subsets is equal to the minimum Euclidian distance between the data symbols of said signal constellation as a whole.

12. The invention of claim 10 wherein said constellation comprises a plurality of subsets, wherein said second redundancy encoder is a finite state machine defined by a trellis diagram having a plurality of current states, a plurality of next states and a plurality of state transitions connecting ones of said current states to ones of said next states, wherein each of said state transitions has an assigned one of said subsets, and wherein said selecting and said second redundancy code are such that the inter-subset minimum distance between the subsets assigned to the state transitions that originate from a given current state or merge into a given next state of said trellis diagram is maximized.

13. The invention of claims 1, 7, 8 or 9 comprising the further step of applying to a communications channel a signal which is a function of the selected symbol.

14. A method comprising the steps of encoding a current one of a sequence of input bit groups using a first redundancy code to generate an expanded group of first redundancy encoder output bits, each of which is a function of at least one bit from the current input bit group and at least one previous input bit group, encoding a predetermined number of said first redundancy encoder output bits using a second redundancy code to generate an expanded group of second redundancy encoder output bits, selecting a data symbol from a predetermined signal constellation as a function of a plurality of bits, said plurality of bits including any remaining ones of said first redundancy encoder output bits and said second redundancy encoder output bits, said data symbol being represented by at least one signal space coordinate which is a function of more than one of said plurality of bits, wherein in said selecting step, each different pattern of said plurality of bits identifies a corresponding subset of symbols of said signal constellation, and the minimum Euclidian distance between any two of said subsets is not a function of the Hamming distance between the two corresponding bit patterns, wherein said expanded group of second redundancy encoder output bits includes all of said predetermined number of said first redundancy encoder output bits as well as a redundant bit, and wherein said constellation is partitioned into two subconstellations with the intra-subconstellation minimum distance being maximized, wherein each of said subconstellations comprises a plurality of subsets, wherein said first redundancy encoder is a finite state machine defined by a trellis diagram having a plurality of current states, a plurality of next states and a plurality of state transitions connecting ones of said current states to ones of said next states, wherein each of said state transitions has an assigned one of said subsets, and wherein said selecting and said first redundancy code are such that, for each subconstellation, the inter-subset minimum distance between the subsets assigned to the state transitions that originate from a given current state or merge into a given next state of said trellis diagram is maximized.

15. A method comprising the steps of receiving a sequence of input bit groups, selecting a data symbol from a predetermined signal constellation as a function of a plurality of data-symbol-determining bits, said data symbol being represented by at least one signal space coordinate which is a function of more than one of said data-symbol-determining bits, said data-symbol-determining bits being generated by the steps of using a first redundancy code to generate an expanded group of first redundancy encoder output bits, each of which is a function of at least one bit from a current one of said input bit groups or a previous one of said input bit groups, and using a second redundancy code to generate an expanded group of second redundancy encoder output bits which are a function of a predetermined number of said first redundancy encoder output bits, said data-symbol-determining bits including any remaining ones of said first redundancy encoder output bits and said second redundancy encoder output bits, wherein said predetermined number of first redundancy encoder output bits is less than the number of bits in said expanded group of said first redundancy encoder output bits.

16. A method comprising the steps of receiving a sequence of input bit groups, selecting a data symbol from a predetermined signal constellation as a function of a plurality of data-symbol-determining bits, said data symbol being represented by at least one signal space coordinate which is a function of more than one of said data-symbol-determining bits, said data-symbol-determining bits being generated by the steps of using a first redundancy code to generate an expanded group of first redundancy encoder output bits, each of which is a function of at least one bit from a current one of said input bit groups and a previous one of said input bit groups, interleaving the expanded groups of said first redundancy encoder output bits on a bit-group-by-bit-group basis, and using a second redundancy code to generate an expanded group of second redundancy encoder output bits which are a function of a predetermined number of the interleaved first redundancy encoder output bits, said data-symbol-determining bits including any remaining ones of said first redundancy encoder output bits and said second redundancy encoder output bits, wherein each of said redundancy codes implements a finite state machine having a current state, and wherein both the output bits generated by each redundancy encoder and a next state of said each redundancy encoder are each a function of said current state and of the bits then being encoded.

17. The invention of claim 16 wherein the bits of said expanded group of first redundancy encoder output bits are not a function of bits in any future input bit groups.

18. The invention of claim 16 wherein the selected data symbol is represented by more than two signal space coordinates.

19. The invention of claim 16 comprising the further step of encoding a second sequence of input bit groups using at least one predetermined upper level code, said selecting step selecting said data symbol as a further function of at least one of the encoded second sequence bits.

20. The invention of claim 16 or 19 wherein in said selecting step, said data symbol is selected as a further function of at least one further bit.

21. The invention of claim 16 wherein said signal constellation includes more than four data symbols.

22. The invention of claim 21 wherein in said selecting step, each different pattern of said data-symbol-determining bits identifies a corresponding subset of the symbols of said signal constellation, and the minimum Euclidian distance between any two of said subsets is not a function of the Hamming distance between the two corresponding bit patterns.

23. The invention of claim 16 or 22 wherein said expanded group of second redundancy encoder output bits includes all of said first redundancy encoder output bits as well as a redundant bit.

24. The invention of claim 23 wherein said selecting is such that when a pair of said bit patterns differ only in the value of said redundant bit, the minimum Euclidian distance between the two corresponding subsets is equal to the minimum Euclidian distance between the data symbols of said signal constellation as a whole.

25. The invention of claim 23 wherein said constellation comprises a plurality of subsets, wherein said second redundancy encoder is a finite state machine defined by a trellis diagram having a plurality of current states, a plurality of next states and a plurality of state transitions connecting ones of said current states to ones of said next states, wherein each of said state transitions has an assigned one of said subsets, and wherein said selecting and said second redundancy code are such that the inter-subset minimum distance between the subsets assigned to the state transitions that originate from a given current state or merge into a given next state of said trellis diagram is maximized.

26. The invention of claims 16, 15, 18, 21 or 22 comprising the further step of applying to a communications channel a signal which is a function of the selected symbol.

27. A method for use in digital data transmission comprising the steps of receiving a sequence of input bit groups, selecting a data symbol from a predetermined signal constellation as a function of a plurality of data-symbol-determining bits, said data symbol being represented by at least one signal space coordinate which is a function of more than one of said data-symbol-determining bits, said data-symbol-determining bits being generated by the steps of using a first redundancy code to generate an expanded group of first redundancy encoder output bits, each of which is a function of at least one bit from a current one of said input bit groups and at least one previous one of said input bit groups, using a second redundancy code to generate an expanded group of second redundancy encoder output bits which are a function of a predetermined number of said first redundancy encoder output bits, said data-symbol-determining bits including any remaining ones of said first redundancy encoder output bits and said second redundancy encoder output bits, wherein said signal constellation includes more than four data symbols, wherein in said selecting step, each different pattern of said data-symbol-determining bits identifies a corresponding subset of the symbols of said signal constellation, and the minimum Euclidian distance between any two of said subsets is not a function of the Hamming distance between the two corresponding bit patterns, wherein said expanded group of second redundancy encoder output bits includes all of said first redundancy encoder output bits as well as a redundant bit, and wherein said constellation is partitioned into two subconstellations with the intra-subconstellation minimum distance being maximized, wherein each of said subconstellations comprises a plurality of subsets, wherein said first redundancy encoder is a finite state machine defined by a trellis diagram having a plurality of current states, a plurality of next states and a plurality of state transitions connecting ones of said current states to ones of said next states, wherein each of said state transitions has an assigned one of said subsets, and wherein said selecting and said first redundancy code are such that, for each subconstellation, the inter-subset minimum distance between the subsets assigned to the state transitions that originate from a given current state or merge into a given next sate of said trellis diagram is maximized.

28. A method comprising the steps of
trellis encoding a current one of a sequence of input bit groups to generate an expanded group of first trellis encoder output bits,
trellis encoding a predetermined number of said first trellis encoder output bits to generate an expanded group of second trellis encoder output bits, and
selecting a data symbol from a predetermined signal constellation as a function of any remaining ones of said first trellis encoder output bits and said second trellis encoder output bits,
wherein said data symbol is selected as a further function of at least one other bit.

29. The invention of claim 28 wherein said at least one other bit is a bit that has been encoded by an encoding step different from said trellis encoding steps.

30. A method comprising the steps of
trellis encoding a current one of a sequence of input bit groups to generate an expanded group of first trellis encoder output bits,
trellis encoding a predetermined number of said first trellis encoder output bits to generate an expanded group of second trellis encoder output bits, and
selecting a data symbol from a predetermined signal constellation as a function of any remaining ones of said first trellis encoder output bits and said second trellis encoder output bits,
wherein said predetermined number of first trellis encoder output bits is less than the number of bits in said expanded group of said first trellis encoder output bits.

31. The invention of claim 30 wherein each input bit group of said sequence comprises more than two bits.

32. The invention of claim 30 wherein the data symbols of said signal constellation are represented by more than two coordinates.

33. The invention of claim 30 wherein said signal constellation includes more than four data symbols.

34. The invention of claim 30 wherein in said selecting step said data symbol is selected as a further function of at least one other bit.

35. The invention of claim 34 wherein said at least one other bit is a bit that has been encoded by an encoding step different from said trellis encoding steps.

36. The invention of claim 30 wherein in said selecting step, each different pattern of the bits used in said selecting step identifies a corresponding subset of the symbols of said signal constellation, and the minimum Euclidian distance between any two of said subsets is not a function of the Hamming distance between the two corresponding bit patterns.

37. The invention of claim 36 wherein said selecting is such that when a pair of said bit patterns differ only in the value of said redundant bit, the minimum Euclidian distance between the two corresponding subsets is equal to the minimum Euclidian distance between the data symbols of said signal constellation as a whole.

38. A method comprising the steps of
trellis encoding a current one of a sequence of input bit groups to generate an expanded group of first trellis encoder output bits,
trellis encoding a predetermined number of said first trellis encoder output bits to generate an expanded group of second trellis encoder output bits,
selecting a data symbol from a predetermined signal constellation as a function of any remaining ones of said first trellis encoder output bits and said second trellis encoder output bits, and
interleaving the expanded groups of said first trellis encoder output bits prior to the second trellis encoding step,
wherein said interleaving step is performed on a bit-group-by-bit-group basis.

39. The invention of claim 38 wherein each input bit group of said sequence comprises more than two bits.

40. The invention of claim 38 wherein the data symbols of said signal constellation are represented by more than two coordinates.

41. The invention of claim 38 wherein said selected data symbol is represented by more than two signal space coordinates.

42. The invention of claim 38 comprising the further step of encoding a second sequence of input bit groups using at least predetermined upper level code, said selecting step selecting said data symbol as a further function of at least one of the encoded second sequence bits.

43. The invention of claim 38 wherein in said selecting step, said data symbol is selected as a further function of at least one further bit.

44. The invention of claim 38 wherein said signal constellation includes more than four data symbols.

45. The invention of claim 38 wherein in said selecting step, each different pattern of the bits used in said selecting step identifies a corresponding subset of the symbols of said signal constellation, and the minimum Euclidian distance between any two of said subsets is not a function of the Hamming distance between the two corresponding bit patterns.

46. The invention of claim 45 wherein said selecting is such that when a pair of said bit patterns differ only in the value of said redundant bit, the minimum Euclidian distance between the two corresponding subsets is equal to the minimum Euclidian distance between the data symbols of said signal constellation as a whole.

47. The invention of any of claims 28 through 30 or 38 through 46 comprising the further step of applying to a communications channel a signal which is a function of the selected symbol.

48. Apparatus comprising
a first redundancy encoder adapted to encode a current one of a sequence of input bit groups using a first redundancy code to generate an expanded group of first redundancy encoder output bits, each of which is a function of at least one bit from the current input bit group or at least one previous input bit group,
a second redundancy encoder adapted to encode a predetermined said first redundancy encoder output bits using a second redundancy code to generate an expanded group of second redundancy encoder output bits, and
a mapper adapted to select a data symbol from a predetermined signal constellation as a function of a plurality of bits, said plurality of bits including any remaining ones of said first redundancy encoder output bits and said second redundancy encoder output bits, said data symbol being represented by at least one signal space coordinate which is a function of more than one of said plurality of bits,
wherein said predetermined number of first redundancy encoder output bits is less than the number of bits in said expanded group of first redundancy encoder output bits.

49. Apparatus comprising
a first redundancy encoder adapted to encode a current one of a sequence of input bit groups using a first redundancy code to generate an expanded group of first redundancy encoder output bits, each of which is a fiction of at least one bit from the current input bit group or at least one previous input bit group, a second redundancy encoder adapted to encode a predetermined number of the interleaved first redundancy encoder output bits using a second redundancy code to generate an expanded group of second redundancy encoder output bits, and a mapper adapted to select a data symbol from a predetermined signal constellation as a function of a plurality of bits, said plurality of bits including any remaining ones of said first redundancy encoder output bits and said second redundancy encoder output bits, said data symbol being represented by at least one signal space coordinate which is a function of more than one of said plurality of bits, wherein said mapper selects said data symbol in such a way that each different pattern of said plurality of bits identifies a corresponding subset of the symbols of said signal constellation, and the minimum Euclidian distance between any two of said subsets is not a function of the Hamming distance between the two corresponding bit patterns, wherein said expanded group of second redundancy encoder output bits includes all of said predetermined number of said first redundancy encoder output bits as well as a redundant bit, and wherein said constellation is partitioned into two subconstellations with the intra-subconstellation minimum distance being maximized, wherein each of said subconstellations comprises a plurality of subsets, wherein said first redundancy encoder is a finite state machine defined by a trellis diagram having a plurality of current states, a plurality of next states and a plurality of state transitions connecting ones of said current states to ones of said next states, wherein each of said state transitions has an assigned one of said subsets, and wherein said selecting and said first redundancy code are such that, for each subconstellation, the inter-subset minimum distance between the subsets assigned to the state transitions that originate from a given current state or merge into a given next state of said trellis diagram is maximized.

50. The invention as defined in any of claims 30, 38, 45 or 46 wherein said expanded group of second trellis encoder output bits includes all of said predetermined number of said first trellis encoder output bits as well as a redundant bit.

51. Apparatus comprising a first redundancy encoder adapted to encode a current one of a sequence of input bit groups using a first redundancy code to generate an expanded group of first redundancy encoder output bits, each of which is a function of at least one bit from the current input bit group and at least one previous input bit group, means for interleaving the expanded groups of said first redundancy encoder output bits, the interleaving being on a bit-group-by-bit-group basis, a second redundancy encoder adapted to encode a predetermined number of the interleaved first redundancy encoder output bits using a second redundancy code to generate an expanded group of second redundancy encoder output bits, and a mapper adapted to select a data symbol from a predetermined signal constellation as a function of a plurality of bits, said plurality of bits including any remaining ones of said first redundancy encoder output bits and said second redundancy encoder output bits, said data symbol being represented by at least one signal space coordinate which is a function of more than one of said plurality of bits, wherein said predetermined number of first redundancy encoder output bits includes at least one bit which is a function of at least one bit from said at least one previous input bit group.

52. The invention of claim 51 wherein the bits of said expanded group of first redundancy encoder output bits are not a function of bits in any future input bit groups.

53. The invention of claim 51 wherein at least one of said first redundancy encoder output bits is a bit from said current input bit group.

54. The invention of claim 51 wherein said selected data symbol is represented by more than two signal space coordinates.

55. The invention of claim 51 wherein each of said redundancy encoders is a finite state machine having a current state, and wherein both the output bits generated by each redundancy encoder, and a next state of said each redundancy encoder, are each a function of said current state and of the bits then being encoded.

56. The invention of claim 51 further comprising an encoder for encoding a second sequence of input bit groups using at least one predetermined upper level code, said mapper selecting said data symbol as a further function of at least one of the encoded second sequence bits.

57. The invention of claim 51 wherein said mapper selects said data symbol as a further function of at least one further bit.

58. The invention of claim 51 wherein said signal constellation includes more than four data symbols.

59. The invention of claim 51 wherein said mapper selects said data symbol in such a way that each different pattern of said plurality of bits identifies a corresponding subset of the symbols of said signal constellation, and the minimum Euclidian distance between any two of said subsets is not a function of the Hamming distance between the two corresponding bit patterns.

60. The invention of claims 51 or 59 wherein said expanded group of second redundancy encoder output bits includes all of said predetermined number of said first redundancy encoder output bits as well as a redundant bit.

61. The invention of claim 60 wherein said mapper carries out said selecting in such a way that when a pair of said bit patterns differ only in the value of said redundant bit, the minimum Euclidian distance between the two corresponding subsets is equal to the minimum Euclidian distance between the data symbols of said signal constellation as a whole.

62. The invention of claim 60 wherein said constellation comprises a plurality of subsets, wherein said second redundancy encoder is a finite state machine defined by a trellis diagram having a plurality of current states, a plurality of next states and a plurality of state transitions connecting ones of said current states to ones of said next states, wherein each of said state transitions has an assigned one of said subsets, and wherein the selecting of said data symbol and said second redundancy code are such that the inter-subset minimum distance between the subsets assigned to the state transitions that originate from a given current state or merge into a given next state of said trellis diagram is maximized.

63. The invention of any of claims 48, 49, or 51 through 59 further comprising apparatus which applies to a communications channel a signal which is a function of the selected symbol.

64. The invention as defined in claims 1, 16 or 51 wherein said predetermined number of first redundancy encoder output bits is less than the number of bits in said expanded group of first redundancy encoder output bits.

* * * * *